US011046575B2

(12) United States Patent
Marsh

(10) Patent No.: US 11,046,575 B2
(45) Date of Patent: Jun. 29, 2021

(54) BROAD RANGE MICRO PRESSURE SENSOR

(71) Applicant: Encite LLC, Burlington, MA (US)

(72) Inventor: Stephen A. Marsh, Carlisle, MA (US)

(73) Assignee: Encite LLC, Burlington, MA (US)

( * ) Notice: Subject to any disclaimer, the term of this patent is extended or adjusted under 35 U.S.C. 154(b) by 302 days.

(21) Appl. No.: 16/163,871

(22) Filed: Oct. 18, 2018

(65) Prior Publication Data

US 2019/0127213 A1 May 2, 2019

Related U.S. Application Data

(60) Provisional application No. 62/579,239, filed on Oct. 31, 2017.

(51) Int. Cl.

| | |
|---|---|
| ***G01L 7/08*** | (2006.01) |
| ***B81B 3/00*** | (2006.01) |
| ***B81B 7/00*** | (2006.01) |
| ***G01R 27/26*** | (2006.01) |
| ***B81C 1/00*** | (2006.01) |
| ***G01L 9/00*** | (2006.01) |

(52) U.S. Cl.

CPC .......... *B81B 3/0021* (2013.01); *B81B 3/0072* (2013.01); *B81B 3/0086* (2013.01); *B81B 7/0006* (2013.01); *B81C 1/00111* (2013.01); *B81C 1/00158* (2013.01); *G01L 7/08* (2013.01); *G01L 9/00* (2013.01); *G01L 9/0072* (2013.01); *G01R 27/2605* (2013.01); *B81B 2201/0264* (2013.01)

(58) Field of Classification Search

CPC ... B81B 3/0021; B81B 3/0086; B81B 3/0072; B81B 7/0006; B81B 2001/0264; G01L 9/00; G01L 9/0072; G01L 9/08–0088; G01L 15/00; G01B 27/2605

See application file for complete search history.

(56) References Cited

U.S. PATENT DOCUMENTS 5,687,767 A * 11/1997 Bowers .................. A62B 18/10 128/205.24
5,836,750 A * 11/1998 Cabuz ................. F04B 43/0063 417/322

(Continued)

FOREIGN PATENT DOCUMENTS

| | | |
|---|---|---|
| CN | 100402850 | 7/2008 |
| WO | WO2009/094572 A1 | 7/2009 |

OTHER PUBLICATIONS

JP Official Action in JP Appln. No. 2016-572361 dated Jan. 4, 2019, 11 pages.
http://www.murata-ps.com/emena/2012-05-22.html 2 pages.

*Primary Examiner* — Alexander A Mercado
(74) *Attorney, Agent, or Firm* — Fish & Richardson P.C.

(57) ABSTRACT

Disclosed is a micro pressure sensor including a plurality of modules that are operative over different ranges of pressure. The modules include a stack of at least two module layers, each module layer including a module body having walls that define a compartment and with the defined compartment partitioned into at least two sub-compartments, a port for fluid ingress or egress disposed in a first wall of the body, with remaining walls of the body being solid walls, a membrane affixed to a first surface of the module body covering the compartment, and an electrode affixed over a surface of the membrane.

27 Claims, 20 Drawing Sheets

(56) References Cited

U.S. PATENT DOCUMENTS 6,106,245 A * 8/2000 Cabuz .................... F04B 43/14 417/322
6,179,586 B1 * 1/2001 Herb .................... F04B 43/043 417/480
6,247,908 B1 6/2001 Shinohara et al.
6,261,066 B1 7/2001 Linnemann
6,443,154 B1 9/2002 Jalde
6,568,286 B1 * 5/2003 Cabuz .................... F04B 43/14 73/863.33
6,758,107 B2 6/2004 Cabuz
6,889,567 B2 * 5/2005 Cabuz .................. F04B 43/043 73/863.23
7,090,471 B2 * 8/2006 Xie ........................ F04B 43/14 417/53
7,802,970 B2 9/2010 Singhal et al.
2002/0029814 A1 3/2002 Unger et al.
2003/0068231 A1 * 4/2003 Cabuz .................. F04B 43/043 417/53
2003/0106799 A1 12/2003 Covington et al.
2003/0231967 A1 12/2003 Najafi et al.
2004/0103899 A1 6/2004 Noble
2004/0115068 A1 * 6/2004 Hansen ............ A61M 5/14248 417/379
2009/0074595 A1 3/2009 Chen et al.
2009/0129952 A1 5/2009 Patrascu et al.
2009/0130607 A1 5/2009 Slafer
2010/0181871 A1 7/2010 Daniel et al.
2011/0207328 A1 8/2011 Speakman
2013/0046330 A1 4/2013 Kabasawa et al.
2013/0109990 A1 * 5/2013 Akingba ................ A61B 5/113 600/529
2013/0319125 A1 12/2013 Wang et al.
2013/0327149 A1 * 12/2013 Nakatani ............... G01L 9/0073 73/754
2014/0147346 A1 5/2014 Chitnis et al.
2014/0208822 A1 * 7/2014 Ferran ................... G01L 27/005 73/1.15
2015/0008541 A1 1/2015 Hong
2016/0131126 A1 * 5/2016 Marsh ................... F04B 19/006 156/153
2018/0038754 A1 * 2/2018 Marsh ..................... G01L 19/00

* cited by examiner

| Capacitance (pF) | | Separation | Pressure |
|---|---|---|---|
| one | Seven | $D_{air}$ (um) | Cm $H_2O$ |
| 0.38 | 2.68 | 50.00 | 0.00 |
| 0.42 | 2.97 | 45.00 | 0.02 |
| 0.47 | 3.32 | 40.00 | 0.18 |
| 0.54 | 3.77 | 35.00 | 0.62 |
| 0.62 | 4.36 | 30.00 | 1.47 |
| 0.74 | 5.17 | 25.00 | 2.86 |
| 0.91 | 6.34 | 20.00 | 4.95 |
| 1.17 | 8.21 | 15.00 | 7.86 |
| 1.66 | 11.63 | 10.00 | 11.73 |
| 2.85 | 19.93 | 5.00 | 16.70 |
| 9.96 | 69.73 | 0.00 | 22.91 |

FIG. 9

BROAD RANGE MICRO PRESSURE SENSOR

This application claims priority under 35 U.S.C. § 119 to U.S. Provisional Patent Application Ser. No. 62/579,239, filed Oct. 31, 2017, and entitled "Broad Range Micro Pressure Sensor," the entire contents of which is hereby incorporated by reference.

BACKGROUND

This specification relates to pressure sensor devices and systems.

A pressure sensor detects or measures a fluid pressure, i.e., a force exerted by a fluid, being the force necessary to oppose the fluid from expanding. Pressure sensors are used in a variety of control and monitoring applications and can be used to indirectly measure other physical quantities such as fluid flow, fluid speed, and altitude. Typically, pressure sensors are fabricated using various techniques and technologies, each of which find use according to performance, application suitability and cost considerations.

Typical pressure sensors include transducers that generate an electrical signal as a function of the pressure imposed on the transducer, which is an example of a force collector type pressure sensor. A force collector type uses a force collector (such as diaphragm, piston, etc.) to measure strain (or deflection) resulting from a force applied to the force collector. Types of force collectors include piezo-resistive strain gauge types that use the piezo-resistive effect to detect strain due to applied pressure and a piezoelectric type that uses the piezoelectric effect in certain materials such as quartz, certain ceramics and certain polymers.

Another type is a capacitive type that uses a diaphragm and pressure cavity to create a variable capacitor to detect strain due to applied pressure. Common technologies use metal, ceramic, and silicon diaphragms. Such sensors can be fabricated using silicon MEMS (microelectromechanical systems) techniques.

SUMMARY

According to an aspect, a pressure sensor includes a plurality of module stages, at least one of the plurality of module stages operative over a first range of pressure and at least one other of the plurality of module stages operative over a second, different range of pressure, with each module stage including a stack of at least two module layers, each module layer including a module body having walls that define a compartment and with the defined compartment partitioned into at least two sub-compartments, a port for fluid ingress or egress disposed in a first wall of the module body, with remaining walls of the module body being solid, a membrane affixed to a first surface of the module body covering the compartment, and an electrode affixed over a surface of the membrane.

According to an additional aspect, a micro pressure sensor includes a first module operative over a first range of pressure, the first module including a first stack of a first plurality of first module layers, each first module layer including a first module body having walls that define a compartment and with the defined compartment partitioned into at a first plurality of sub-compartments, a first port for fluid ingress or egress disposed in a first wall of the first module body, with remaining walls of the first module body being solid, a first membrane affixed to a first surface of the first module body covering the compartment, and a first electrode affixed over a surface of the first membrane. The micro pressure sensor further includes a second module operative over a second, different range of pressure, the second module affixed in the micro pressure sensor, the second module including a second stack of a second plurality of second module layers, each second module layer including a second module body having walls that define a compartment and with the defined compartment partitioned into at a second plurality of sub-compartments that are different in one or more of number and size of sub-compartments than the first plurality of sub-compartment, a second port for fluid ingress or egress disposed in a first wall of the second module body, with remaining walls of the second module body being solid walls, a second membrane affixed to a first surface of the second module body covering the compartment, and an electrode affixed over a surface of the membrane.

Other aspects include methods of fabrication.

The micro pressure sensors can be used for performing pressure sensing for a variety of industrial, medical, and biological applications. The micro pressure sensors can be fabricated using reasonably inexpensive techniques and thus provide inexpensive micro pressure sensors for various applications. In particular embodiments, the micro pressure sensors are fabricated using roll to roll manufacturing techniques. The micro pressure sensors are operable over a relatively wide range of pressures and have relatively high levels of sensitivity to pressure changes over wide ranges of pressure, relative to a micro pressure sensor comprised of standard sized compartment(s).

The details of one or more embodiments of the invention are set forth in the accompanying drawings and the description below. Other features, objects, and advantages of the invention are apparent from the description and drawings, and from the claims.

DESCRIPTION OF DRAWINGS

FIG. 9 is table showing capacitance vs. membrane separation and pressure.

DETAILED DESCRIPTION

Overview

Micro-pressure sensors described herein are made using micro fabrication methods and can be used for sensing pressure in various industrial, commercial, medical, and biological applications. The micro pressure sensors are fabricated on a micron/millimeter scale. Several fabrication techniques are disclosed.

One type of micro pressure sensors is a narrow pressure range micro pressure sensor as described in my published patent application US-2018-0038754-A1 assigned to the assignee of the present application, and which application is incorporated herein by reference in its entirety. By narrow range micro pressure sensor is meant that a given module will be operative over a narrow range of pressures relative to a broad range micro pressure sensor. The micro pressure sensor of the incorporated by reference application has a single chamber that is compartmentalized into plural compartments. Each compartment experiences and is responsive to the same pressure over a given range of pressure. The narrow range type is a micro pressure sensor having high sensitivities over a relatively narrow range of pressure (referred to herein as a narrow range micro pressure sensor).

Describe below is another type of micro pressure sensor that has high sensitivities over a broad range of pressures, as is referred to herein as a broad range micro pressure sensor. Two types of broad range micro pressure sensors are described, a broad range micro pressure sensor 10 and a stacked broad range micro pressure sensor 100.

Broad Range Micro Pressure Sensor

Figure 1:
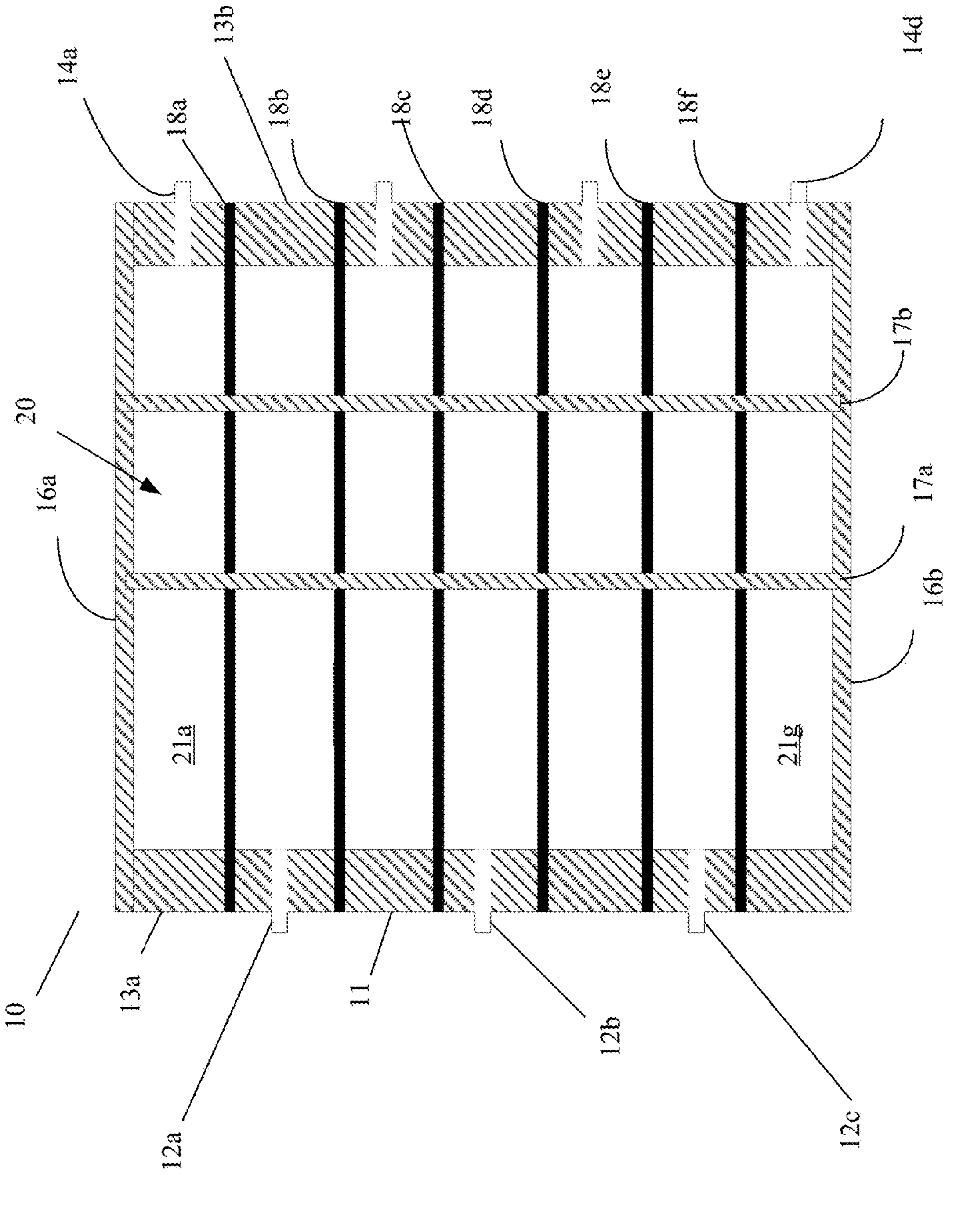
FIGS. 1, 2, 2A and 3 are schematic functional, cross-sectional diagrams of a module stage of a broad range micro pressure sensor showing the micro pressure sensor in a rest mode, an overpressure mode, a greater overpressure mode, and in an under-pressure mode respectively.
Figure 3:
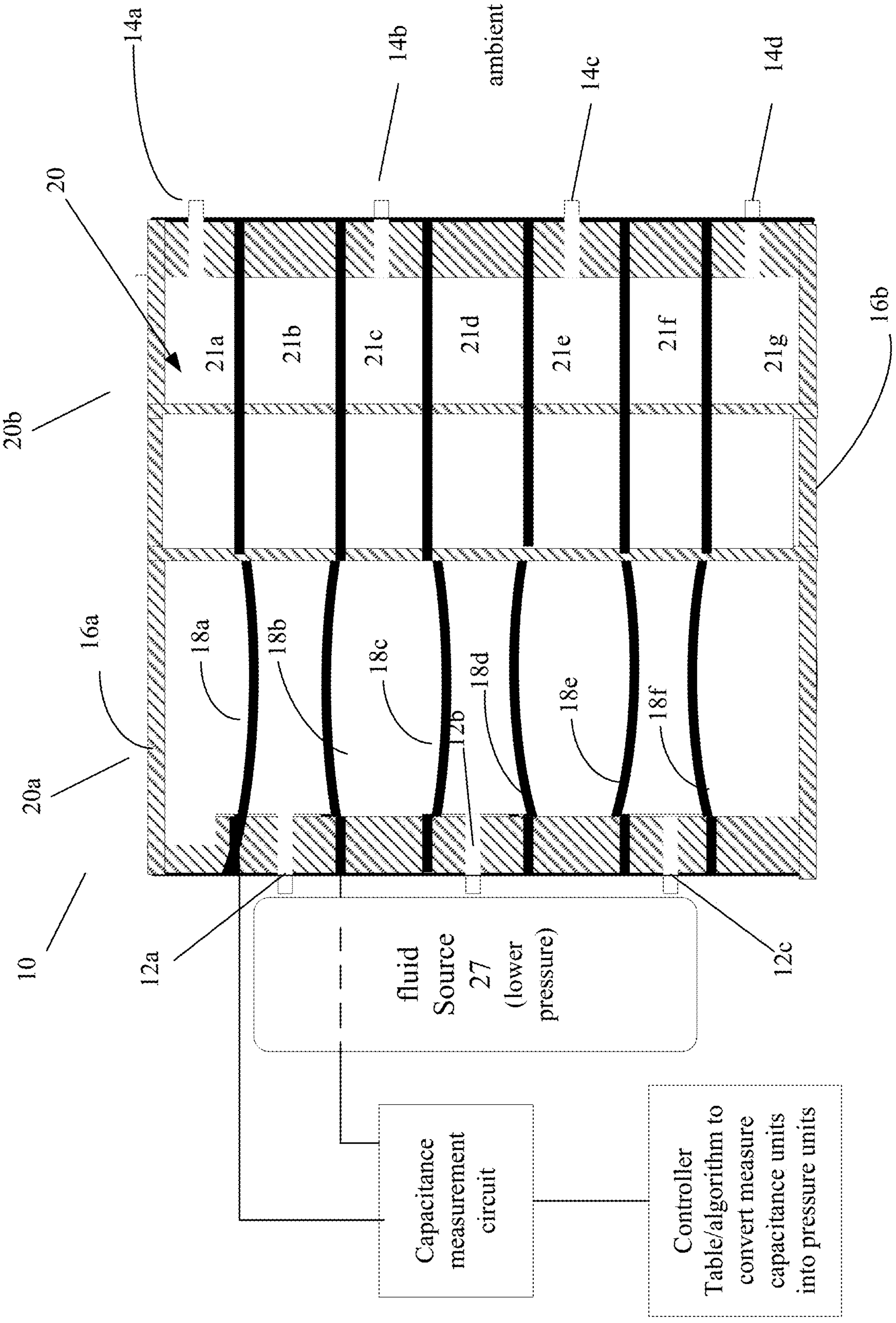
Figure 4:
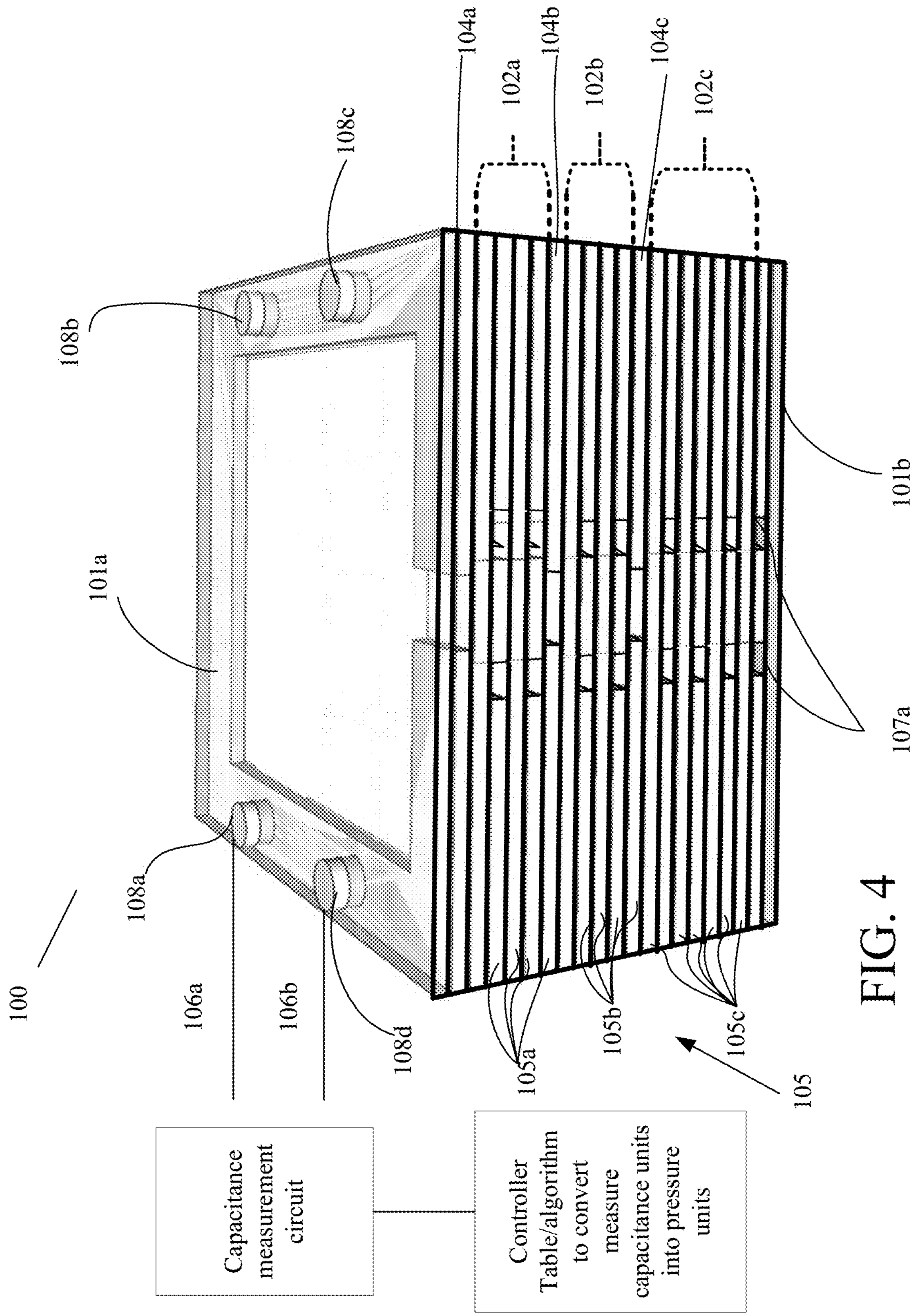
FIG. 4 is an isometric view of a micro pressure sensor comprised of plural repeatable module layers based on the concepts described in FIGS. 1-3.

Referring to FIG. 1, a micro pressure sensor 10 is shown. The micro pressure sensor 10 has high sensitivity to pressure changes and can serve as an element of a module stage in a stack of module stages (stages) of a broad range micro pressure sensor 100 (FIG. 4). The micro pressure sensor 10 includes a chamber 20 that is compartmentalized into plural compartments 21a-21g by plural membranes 18a-18f. As with the micro pressure sensor described in the incorporated by reference application the micro pressure sensor 10 includes a sensor body 11 having two walls 13a, 13b along a fluid flow direction, end caps 16a, 16b that are opposite to each other along a direction perpendicular to the fluid flow direction, and two walls, e.g. front and back walls (not shown in the views of FIGS. 1-3) that are orthogonal to two fixed end caps 16a, 16b and walls 13a, 13b. The walls 13a, 13b and 16a, 16b and the front and back walls define the single chamber 20.

Figure 6A:
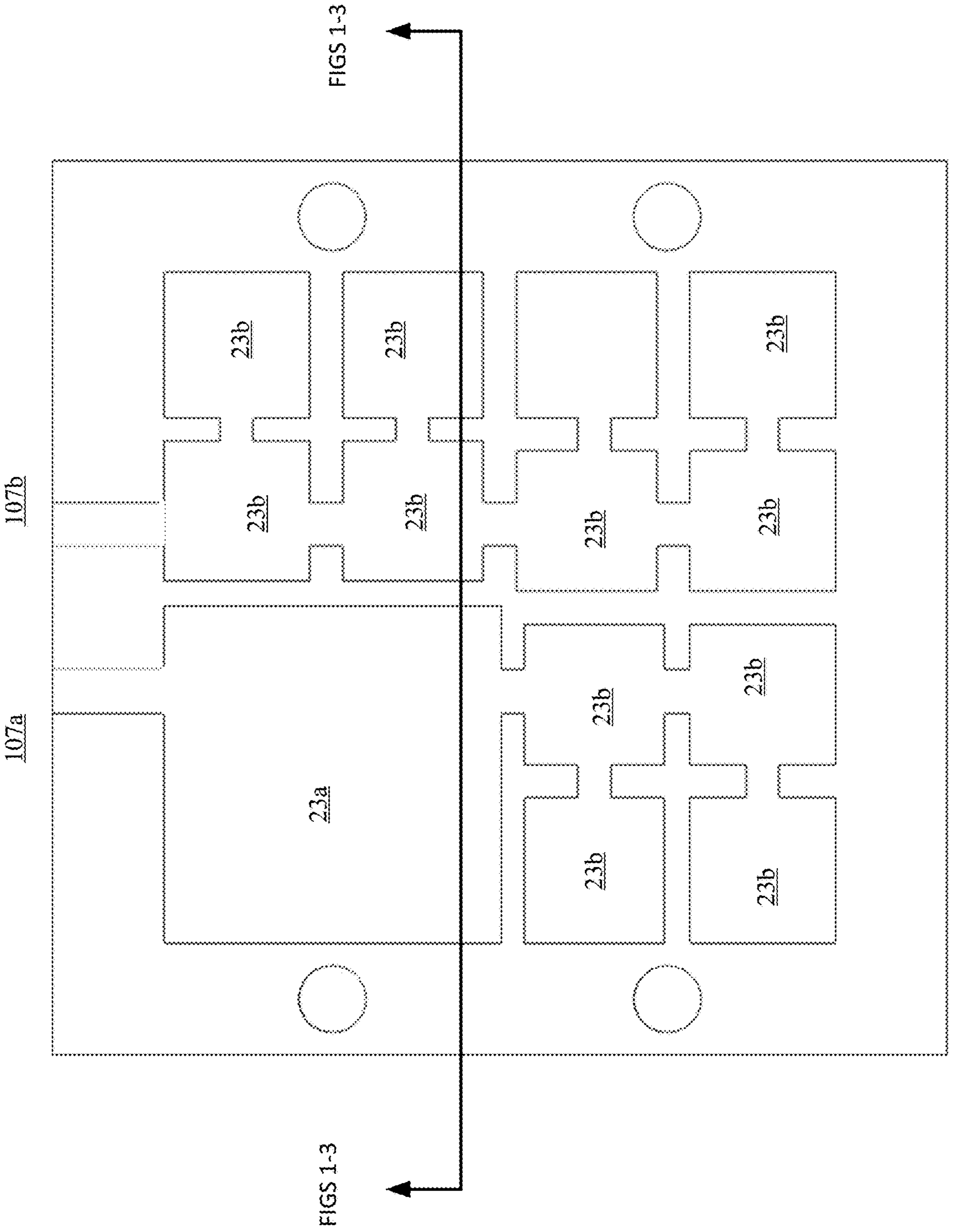
FIGS. 6A-6C are isometric views of different exemplary body layer patterns for forming sub compartments within modular micro pressure sensors.
Figure 6B:
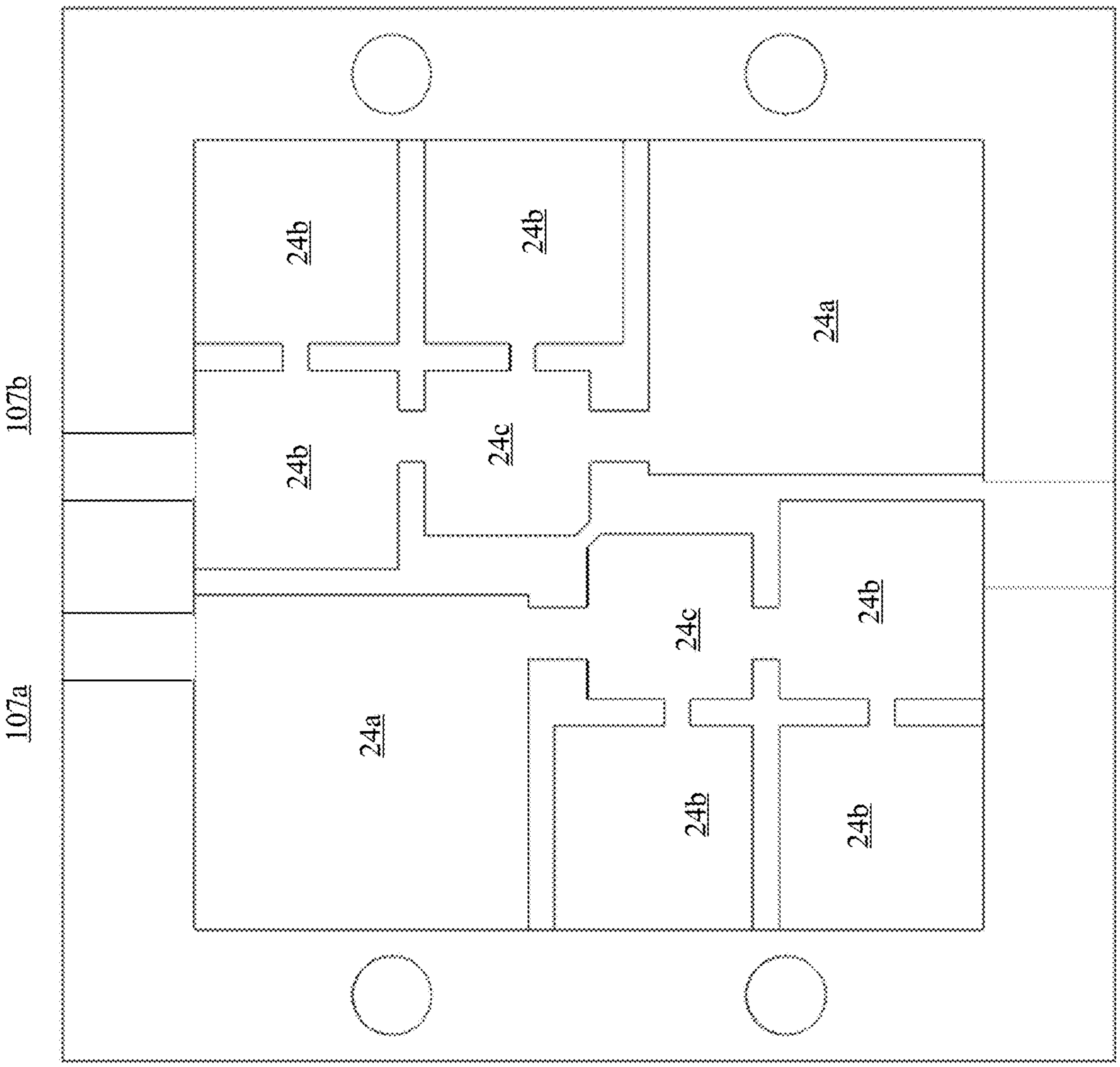
Figure 6C:
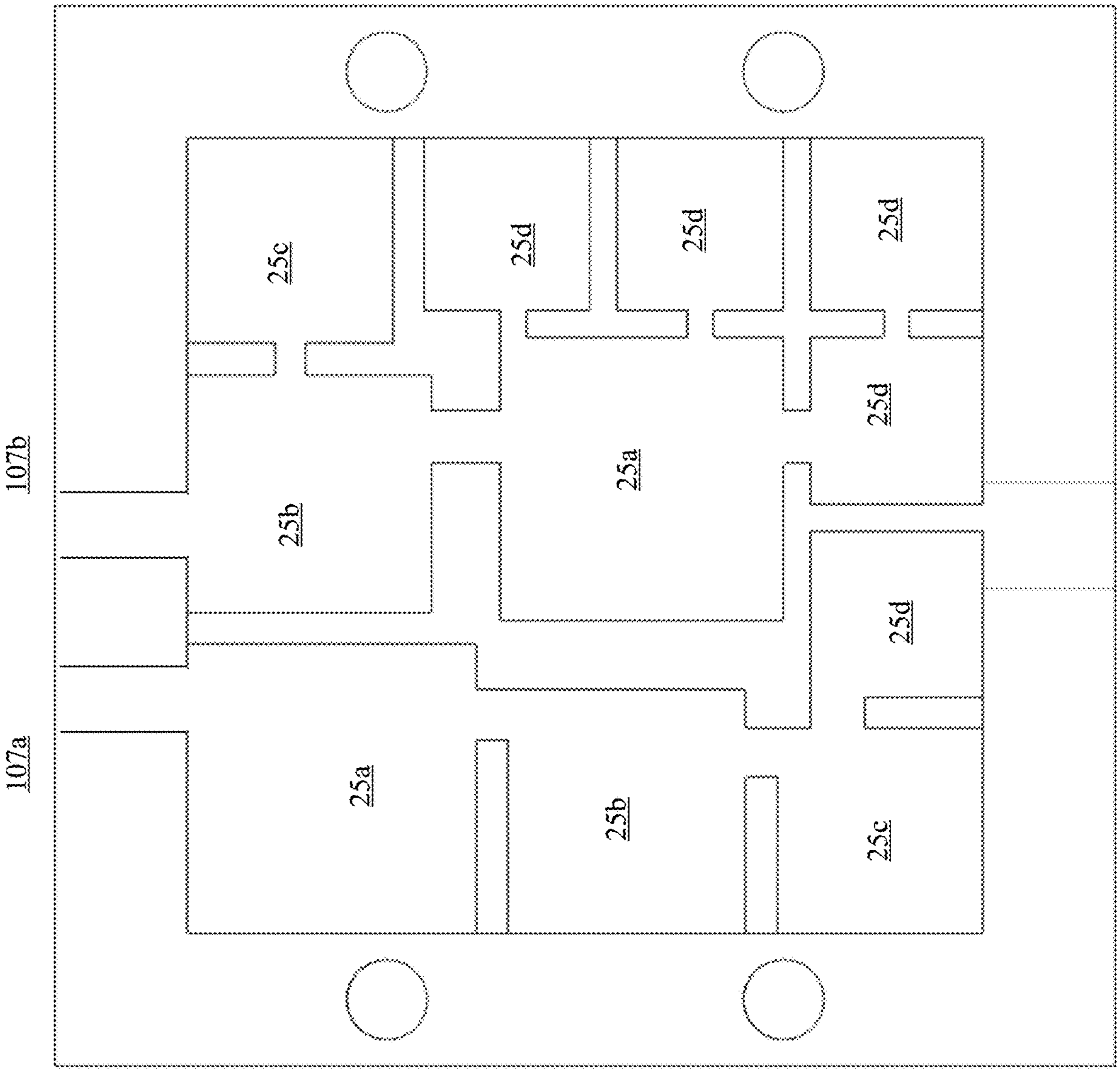

As will be illustrated in more detail in FIGS. 6A-6C, each of compartments 21a-21g that provide the single chamber 20 is further divided into plural sub-compartments two of which, e.g., sub-compartments 23a-23b are shown (see also FIG. 6A), as well as, other sub-compartments not shown in FIG. 1, but shown in FIG. 6A. Each of the plural sub-compartments 23a-23b (as well as sub-compartments not shown in FIG. 1) is compartmentalized by membrane layers (membranes) 18a-18f. Generally, sub-compartments 23a will have membranes having different surface areas and hence volumes than sub-compartments 23b. However, in some embodiments surface areas and hence volumes can be the same provided that other measures are taken to change the sensitivity of the membranes over compartments 23a, 23b to pressures.

Figure 2:
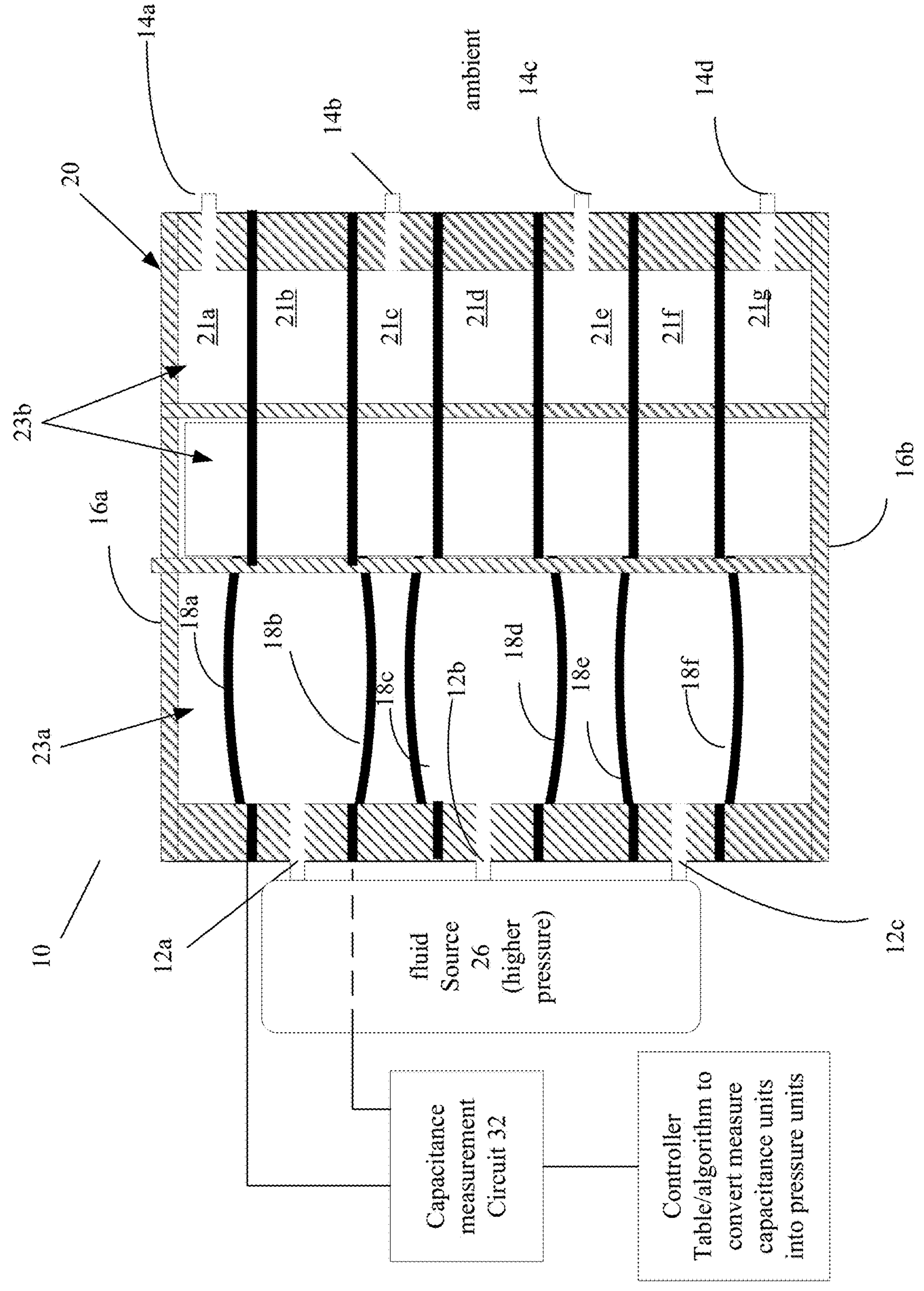

Membranes 18a-18f are anchored between the two end walls 16a, 16b and the front and back walls and on walls, e.g., 17a, 17b that divide the chamber 20 into the plural sub-compartments 23a-23b. While the membranes 18a-18f separate the chamber 20 into plural compartments 21a-21g, the walls (two of which) 17a, 17b are shown and other walls (not shown in FIG. 1, but shown in FIG. 6A) separate each compartment into plural sub-compartments two of which sub-compartments 23a-23b are shown in FIGS. 1-3.

A first set of ports 12a-12c are disposed through wall 13a for fluid access into each of compartments 21b, 21d and 21f, respectively. A second set of ports 14a-14d, are disposed through wall 13b for fluid access into each of compartments 21a, 21c, 21e and 21g, respectively. In this implementation, each compartment 21a-21b includes a port either from the first set of ports 12a-12c or from the second set of ports 14a-14d, but not both, defined in the respective walls. For example, the compartment 21a includes the port 14a in the wall 13b, while the port of the wall 13a in the region of compartment 21a is solid, without any opening.

As will be discussed below the plural sub-compartments, e.g., sub-compartments 23a-23b will provide different degrees of sensitivity within a single compartment to different pressures and pressure ranges.

In FIG. 1, the ports are shown on opposing sides. Ports being on opposing sides is desirable in many embodiments, but is not required. In other embodiments, the ports can be on adjacent sides or indeed on the same side provided that ports acting as inlets or input ports are separated from ports acting as outlets or output ports, by such ports being coupled to different vessels that provide the fluid whose pressure is being measured and the reference. A compartment would have but one inlet or one outlet but not both.

As shown in FIG. 1, this arrangement of a solid wall at one end and a first one of the first set of ports or a first one of the second set of ports at an opposing end is alternated, such as shown for adjacent compartment 21b having port 12a in wall 13a with wall 13b being a solid wall at the region of compartment 21b.

The compartments 21a-21g are fluidic-ally sealed from each other, but each of the sub-compartments within a sub-compartment are fluidic-ally coupled. Two compartments 21a and 21g at the opposite ends of the micro pressure sensor 10 have walls provided by the fixed walls 16a, 16b of the body and a corresponding membrane. Intermediate compartments 21b-21f between the compartments have walls provided by two adjacent membranes with the micro pressure sensor 10 having at least one and generally many intermediate compartments, each of which intermediate compartment walls are provided by two membranes 18a-18f. The micro pressure sensor 10 can sense changes in pressure from a rest position as is illustrated in FIG. 1. Changes in fluid pressures of, e.g., typically gases or in some instances liquids are detected and the micro pressure sensor 10 is constructed with materials, the selection of which takes into consideration the type of fluid that the micro pressure sensor 10 will be configured to sense pressure of as well as a range of pressures over which the micro pressure sensor 10 will have suitable sensitivity.

In the implementations discussed below, pressures are relative to ambient pressure of ambient air. However, other references may be used.

Also, in the discussion below broad range micro pressure sensors are relative to a narrow range micro pressure sensor.

While the discussion below will focus on broad range micro pressure sensors, it would be helpful to first define a narrow range micro pressure sensor, and to discuss general features and operational characteristics common to both narrow and broad range micro pressure sensors.

A narrow range micro pressure sensor is comprised of one or more standard pressure sensor chambers 20 that have identical pressure sensor characteristics, i.e., sensitivity over a narrow pressure range. A standard pressure sensor chamber 20 is defined as a single chamber that has at least two compartments (and which could have many such compartments) with each of the compartment being identical in pressure sensing characteristics. One way for compartments to be identical in pressure sensing characteristics is by having the compartments being identical in size, volume, elastic characteristics of the membranes, and characteristics of electrodes.

A narrow range pressure sensor will have high sensitivity over a defined, yet relatively limited, i.e., narrow, range of pressure in comparison to the broad range micro pressure sensor 10. The range of sensitivity to pressure is based on the size and volume characteristics of compartments, elastic characteristics of the membranes (Young's modulus and thickness), and characteristics of electrodes (pattern, thickness, etc.) that affect changes in capacitance measured between electrodes of the micro pressure sensor.

With either the narrow or the broad range micro pressure sensors, although six membranes 18*a*-18*f* are shown in FIGS. 1-3 (providing seven compartments), the micro pressure sensor 10 can have fewer membranes and thus fewer compartments or can be extended with additional intermediate membranes having additional membranes as each compartment can be viewed as a module (see, FIGS. 4-6), with the micro pressure sensor 10 formed of a stack of such modules, as described further below.

Each membrane 18*a*-18*f* has an electrode (not explicitly shown in FIG. 1 attached over a major surface of the membrane 18*a*-18*f*. The electrodes are connected to a capacitance measurement circuit (see FIGS. 2, 3) that delivers voltages to the electrodes according to the type of capacitance measurement circuit employed. In some examples of a capacitance measurement circuit an AC waveform can be used and the capacitance is measured using frequency domain techniques. In other examples of a capacitance measurement circuit a DC waveform is used to measure capacitance using time domain techniques.

When an external fluid is fed to the micro pressure sensor 10 at the same pressure at the reference pressure, the membranes 18*a*-18*f* and thus electrodes are not flexed and the membranes/electrodes are at nominal, rest (quiescent) positions, such as shown in FIG. 1. Each membrane 18*a*-18*f* at rest is substantially parallel to the end walls 16*a*, 16*b* and the compartments 21*a*-21*g* can have the same nominal volume $V_i$, with the membranes 18*a*-18*f* in this implementation being separated by equal distances (thickness of the wall portions).

When activated, by application of a pressure, the membranes 18*a*-18*f* and thus electrodes flex, changing the volume of the respective compartments and more particularly, the distance separating pairs of electrodes on such membranes 18*a*-18*f*. These changes in distance separating pairs of electrodes cause changes in capacitance between pairs of adjacent electrodes, as shown for 18*a*, 18*b* in FIGS. 2, 3.

Changes in volume can be considered as an alternative way to represent pressure changes. A capacitance characteristic is provided by a pair of adjacent electrodes that are separated by a dielectric, e.g., contents of a compartment (i.e., the fluid) and/or the dielectric property of the membrane.

A capacitor is effectively provided by the combination of a pair of electrodes on a pair of adjacent membranes that are separated by distance provided from the respective compartment. A capacitance characteristic of such effective capacitor is determined by the dielectric constant provided by one of the pair of adjacent membranes, the dielectric of the fluid in the compartment, the area of the electrodes and distance that separates the electrodes, e.g., generally at least approximated by a formula for a parallel plate capacitor, given as:

$$C=\varepsilon_r\varepsilon_0 A/d, \text{ where}$$

C is the capacitance, in farads;

A is the area of overlap of the two electrodes, in square meters;

$\varepsilon_r$ is the dielectric constant of the material between the electrodes (sum of dielectric constants of a membrane and fluid);

$\varepsilon_0$ is the electric constant ($\varepsilon_0 \approx 8.854\times10\text{-}12$ F·m−1); and d is the separation between the plates, in meters.

where d is sufficiently small with respect to the smallest chord of A.

A controller (see FIGS. 2, 3) that is either part of a capacitance measurement circuit or a separate circuit references a table/algorithm to convert measured capacitance units into pressure units. Many techniques can be used to measure and detect changes in such capacitance over a bulk capacitance provided by the micro sensor 10 while in a rest condition.

In some embodiments, the distance between two adjacent membranes 18*a*-18*b* in their nominal positions is about 50 microns. In some implementations, each of the compartments 21*a*-21*g* can have similar nominal volumes $V_e$. In such implementations, the distance between the membrane 18*a* in its nominal position and the end wall 16*a* or between the membrane 18*f* in its nominal position and the end wall 16*b* is about 50 microns. The compartments 21*a*-21*g* can also have different sizes. The sizes can be chosen based on, e.g., manufacturing, power consumption, and application considerations. As an example, the micro pressure sensor 10 can have a length of about 1.5 mm, a width of about 1.5 mm, a total height (the cumulative height of different compartments) of 0.05 mm, and a total volume of about 0.1125 $mm^3$. Other configurations are possible.

Compared to a conventional pressure sensor used for similar purposes, the micro pressure sensor 10 may use less material, and thus is subject to less stress. The micro pressure sensor 10 has a size in the micron to millimeter scale, and can provide wide ranges of pressure measurements.

In other embodiments, the ports can be on adjacent sides or indeed on the same side, provided that ports acting as inlets or input ports are separated from ports acting as outlets or output ports, by such ports being coupled to different vessels that provide the fluid whose pressure is being measured and the reference. The described micro pressure sensor 10 is a capacitance type of sensor. Sensing occurs in either of two alternating operations of a fluid overpressure and fluid under pressure in the chamber 20 of the micro pressure sensor 10.

Referring to FIG. 2, with application of an overpressure (higher pressure at ports 12*a*, 12*b* and 12*c* acting as inlets compared to a reference at ports 14*a*-14*d* acting as outlets) from a fluid source 26, end compartments 21*a* and 21*g* are shown compressed as are the intermediate compartments 22*c*, 21*e*. In FIG. 2 the applied overpressure is sufficiently high to cause flexing of portions of membranes 18*a*-18*f* that cover the sub-compartments 23*a* in each compartment 21*a*-21*g*, but the applied overpressure is not sufficiently high to flex portions of the membranes 18*a*-18*f* covering the sub-compartments 23*b* in each compartment 21*a*-21*g*. As will be discussed below, the surface area of the membranes 18*a*-18*f* covering each of the sub-compartments 23*a* will be large enough to allow flexure of the membranes in response to the overpressure applied to ports 12*a*, 12*b* and 12*c* acting as inlets, but the surface area of the membranes 18*a*-18*f* covering each of the sub-compartments 23*b* being smaller and thus the membranes are effectively stiffer over sub-compartment 23*b* than sub-compartment 23*a*. In this illustrated example, the overpressure in sub-compartment 23*b* is insufficient to cause any or at least a significant flexure of the membranes 18*a*-18*f* in response to the overpressure applied to ports 12*a*, 12*b* and 12*c* acting as inlets.

The compression occurs in the end compartments 21*a*, 21*g* when membranes 18*a*, 18*f* move towards respective end walls 16*a*, 16*b* and for the intermediate compartments, 22*c*, 21*e* when adjacent membranes 18*b*, 18*c* and 18*d*, 18*e* move towards each other occupying space of the adjacent compartments 22*c*, 21*e* due to displacement of air from those compartments 22*c*, 22*e*. The movement of these membranes 18*a* and 18*f* reduces the volume of the respective end compartments 21*a*, 21*g* and intermediate compartments 21*c*, 21*e* to discharge fluid (gas or liquid) from those compartments into the ambient (or reference) in those portions of the compartments that are part of the sub-compartment 23*a*, but not sub-compartments 23*b*. Simultaneous to the compression of those compartments, adjacent compartments 21*b*, 21*d*, 21*f* (all being intermediate compartments) are over pressured when respective sets of membranes 18*a*, 18*b*; 18*c*, 18*d*; and 18*e*, 18*f*, move away from each other to expand the respective compartment volumes that are part of the sub-compartment 23*a*, but not sub-compartment 23*b*.

In the overpressure operation (FIG. 2), the inlets 12*a*-12*c* into the sub-compartments 23*a* and 23*b* are fed a fluid under a pressure higher than the reference pressure (ambient in this case) causing the membranes 18*a*-18*f* to flex as shown. That is, when a fluid is fed into port 12*a* (acting as an input port), adjacent membranes 18*a*, 18*b* defining compartment 21*b* will flex or deform away from each other towards adjacent compartments 21*a* and 21*c*, displacing air from those compartment 21*a*, 21*c* through ports 14*a*, 14*b* (acting as output ports) into the ambient. Similarly, the other membranes will likewise flex or bend upon fluid at pressure being introduced into the remaining ports 12*b*, 12*c*.

However, as the overpressure increases, the increased overpressure will cause additional flexure of the membranes 18*a*-18*f* covering the sub-compartments 23*a*, but will start flexing the membranes 18*a*-18*f* portions over sub-compartments 23*b* in response to the increased overpressure applied to ports 12*a*, 12*b* and 12*c* acting as inlets.

Figure 2A:
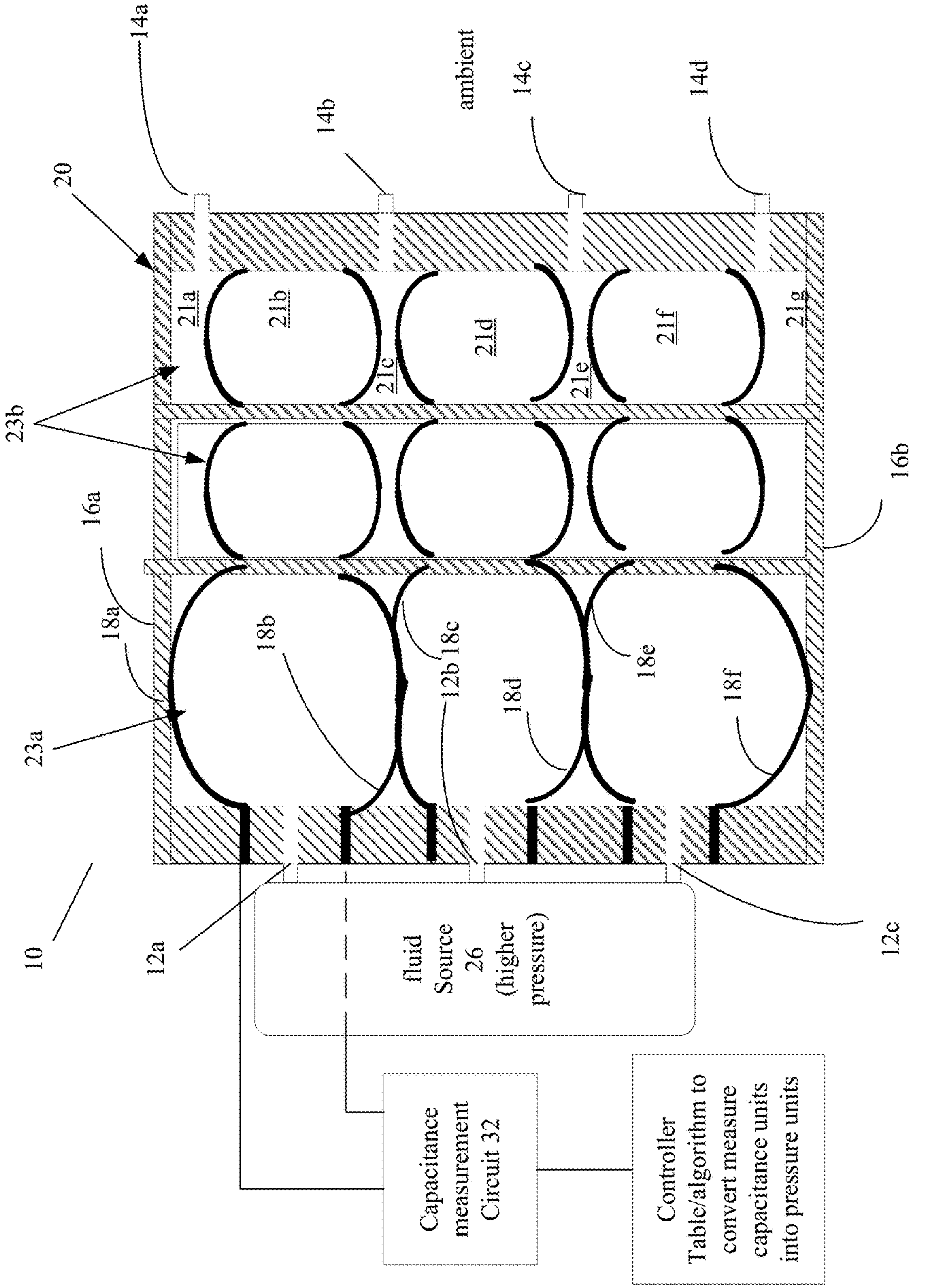

FIG. 2A shows the arrangement of FIG. 2, (see FIG. 2 for description of reference nos. not mentioned) but with an overpressure that is greater than the overpressure in FIG. 2, which is sufficient to cause the membranes 18*a*-18*f* covering each of the sub-compartments 23*a* to completely flex in response to the overpressure applied to ports 12*a*, 12*b* and 12*c* acting as inlets, and being sufficient to cause the membranes 18*a*-18*f* covering each of the sub-compartments 23*b* to flex substantially more than that of FIG. 2, over sub-compartments 23*b*.

Referring now to FIG. 3, in an under-pressure (lower pressure than a reference, e.g., down to a vacuum pressure), at ports acting as inlets 12*a*-12*c* compared to a reference at ports acting as outlets, end compartments 21*a*, 21*g* are shown expanded as are the intermediate compartments 21*c* and 21*d*. In FIG. 3 the applied under-pressure is sufficiently low to flex portions of membrane 18*a*-18*f* that cover the sub-compartment 23*a*, but the applied under-pressure is not sufficiently low to flex portions of membranes 18*a*-18*f* covering the sub-compartment 23*b*.

The expansion occurs in the end compartments 12*a*, 21*g* when membranes 18*a*, 18*f* move away from end walls 16*a*, 16*b* and for compartments 21*c*, 21*d* when adjacent membranes 18*b*, 18*c* and 18 move away from each other. The movement of these membranes increases the volume of the respective end compartments 21*a*, 21*g* and intermediate compartments 21*c*, 21*d*, in those portions of the compartments that are part of the sub-compartment 23*a*, but not sub-compartment 23*b* due to the charge of fluid (gas or liquid) into the compartments coupled to the ambient or reference. Simultaneous to the expansion of those compartments, adjacent compartments 21*b*, 21*d* and 21*f* (all here being intermediate compartments) are discharged when respective sets of membranes move towards each other to reduce the respective compartment volumes in those portions of the compartments that are part of the sub-compartment 23*a*, but not sub-compartment 23*b*.

In the under pressure operation (FIG. 3), the ports 12*a*-12*c* into the sub-compartment 23*a* are coupled to a fluid source 27 that is at a pressure lower than the reference pressure (ambient in this case) causing the membranes to flex, as shown. That is, when a fluid at an under pressure is fed into port 12*a*, adjacent membranes 18*a*, 18*b* defining compartment 21*b* will flex or deform towards each other away from adjacent compartments 21*a* and 21*c*, causing ambient air to enter those compartments 21*a*, 21*c* through ports 14*a*, 14*b* from the ambient in those portions of the compartments that are part of the sub-compartment 23*a*, but not sub-compartment 23*b*. Similarly, the other membranes 18*c*, 18*d* and 18*e*, 18*f* will likewise flex or bend towards each other in response to the fluid at an under pressure being introduced into the remaining ports 12*b*, 12*c*, by ambient entering compartments 21*e*, 21*g* through ports 14*c*-14*d* in those portions of the compartments that are part of the sub-compartment 23*a*, but not sub-compartment 23*b*.

As with FIG. 2, if a sufficient amount of under pressure is experienced, those portions of the membranes 18*a*-18*g* will flex in in FIG. 3, over sub-compartments 23*a* and 23*b*.

Removal of the over pressure or the under pressure applied to the ports returns the micro pressure sensor 10 to the nominal state of FIG. 1.

The micro pressure sensor 10 discussed above thus comprises multiple membranes 18*a*-18*f* each anchored between two fixed walls 13*a*, 13*b* and two fixed walls not shown in those views. The fixed walls 13*a*, 13*b* and the not depicted walls are body layers that form multiple compartments separated by pairs of adjacent membranes. The first and last ones of the compartments are formed by a membrane and a fixed wall that is part of an end cap of the body, but intermediate compartments are provided by pairs of adjacent membranes. Each of the compartments 21*a*-21*g* is divided into plural sub-compartments (sub-compartments 23*a*, 23*b* shown) and portions of the membranes 18*a*-18*f* covering those portions of the sub-compartments 23*a* and 23*b* will flex according to the extent of the overpressure or under-pressure applied to the chamber 20, as a whole.

Comparing FIGS. 2 and 3 that show two operational states of the same micro pressure sensor 10 indicates that in a first mode, pressure higher than the reference is measured, and in a second mode pressure lower than the reference is measured. That is, when actuated, each membrane of a compartment can move in two opposite directions about a central, nominal location at which the membrane rests when it is not actuated.

Electrodes (not explicitly shown in FIGS. 1-3) are on the membranes 18*a*-18*f* of the micro pressure sensor 10. In some implementations a single electrode is provided on a membrane. In other implementations, the electrodes are patterned according to the sub-compartment 23*a*, 23*b* associated with the respective portion of the membranes 18*a*-18*f*. The electrodes for respective sub-compartments 23*a*, 23*b* are connected in parallel to a capacitance measurement circuit 32, discussed below. The combination of two membranes with electrodes, separated by dielectric (the dielectric of the membrane material and air in the compartments) form capacitors. The capacitance of these "capacitors" is measured via conventional capacitance measurement circuits 32. A correlation can be provided between measured capacitance and pressure such as by a controller 34. Various implementations are possible.

Micro pressure sensors having the above described features can be manufactured using various methods such as MEMS processing techniques and so-called roll to roll (R2R) processing. The materials for a micro pressure sensor 10 are chosen based on the features to be provided by the micro pressure sensor 10 and the method of manufacturing of the micro pressure sensor 10. Below are some criteria for choosing the materials of the different parts of micro pressure sensor 10.

Sensor body—The material used for the body may be defined by the requirements. In general, the material needs to be strong or stiff enough to hold its shape to produce the compartment volume. In some implementations, the material is etchable or photo sensitive so that its features can be defined and machined/developed. Sometimes it is also desirable that the material interact well, e.g., adheres, with the other materials in the sensor. Furthermore, the material is electrically non-conductive. Examples of suitable materials include SU8 (negative epoxy resist), and PMMA (Polymethyl methacrylate) resist.

Membrane—The material for this part forms a tympanic structure that charges and discharges fluid in the chamber. As such, the material is required to bend or stretch back and forth over a desired distance and have elastic characteristics. The membrane material is impermeable to the fluids of interest, including gas and liquids, is electrically non-conductive, and can have either a low or a high breakdown voltage characteristic. Examples of suitable materials include silicon nitride, and Teflon. Others are possible.

Electrodes—The material of the electrodes is electrically conductive. Because the electrodes do not conduct significant amounts of current, the material can have a high electrical sheet resistance, although the high resistance feature is not necessarily desirable. The electrodes are subject to bending and stretching with the membranes, and therefore, it is desirable that the material is supple to handle the bending and stretching without fatigue and failure. In addition, the electrode material and the membrane material adhere well, e.g., do not delaminate from each other, under the conditions of operation. Examples of suitable materials include very thin layers of gold and platinum. Others are possible.

Electrical interconnects—The voltages from the capacitance measurement circuits are conducted to the electrode on each membrane of each compartment. Electrically conducting paths to these electrodes can be built using conductive materials, e.g., gold and platinum.

Other materials—when MEMS processing is used in manufacturing the micro pressure sensor, a sacrificial filling material, e.g., polyvinyl alcohol (PVA), can be used. The sacrificial filling material may also be used in R2R processing. In some implementations, solvents are used in the manufacturing process, which may place additional requirements on the various building materials of the micro pressure sensor. It may be possible to print some of the electrical circuit components onto the membranes. In general, while certain materials have been specified above, other materials having similar properties to those mentioned could be used.

Referring now to FIG. 4, a modularized broad range micro pressure sensor 100 is shown. The broad range micro pressure sensor 100 includes plural (at least two and can be many more) here three modules 102*a*-102*c* that are stacked one over the other and spaced by spacer layers 104*a*-104*b*. Each of the three modules 102*a*-102*c* is provided to be highly sensitive to a specific range of pressures. The modularized broad range micro pressure sensor 100 also has end caps 101*a*, 101*b*. End cap 101*a* is partially broken away to reveal an underlying electrode.

The modularized broad range micro pressure sensor 100 differs from the modularized broad range micro pressure sensor 10 (FIGS. 1-3) in that the modularized broad range micro pressure sensor 100 has the plural module stages (stages) 102*a*-102*c*. Operating principals however are similar. Each stage 102*a*-102*c* is comprised of plural compartments, referred to here as modular layers 105*a*-105*c* respectively. Each of the modular layers 105*a*-105*c* has plural sub-compartments. Modular layer 105*a* has plural sub-compartments 23*a*-23*b* (twelve identical versions of 23*b*) as shown in FIG. 6A; modular layer 105*b* has plural sub-compartments 24*a*-24*c* (two identical versions of 24*a*, 6 identical versions of 24*b* and 2 identical versions of 24*c*) as shown in FIG. 6B; and modular layer 105*c* has plural sub-compartments 25*a*-25*d*, (two identical versions of 25*a*, 25*b*, 25*c* and 5 identical versions of 24*d*) as shown in FIG. 6C, respectively. Thus, the sub-compartments in each the of modular layers 105*a*-105*c* are different in number and configuration (see FIGS. 6A-6C). The modularized broad range micro pressure sensor 100 (modularized micro pressure sensor 100) has high sensitivity (relatively large change in capacitance over a broad range of pressure) in comparison to a narrow range micro pressure sensor discussed in the above incorporated by reference patent application.

Each of the three stages 102*a*-102*c* is comprised of at least one and generally several or many module layers 105*a*-105*c*. In FIG. 4, each stage 102*a*-102*c* is shown comprised of several module layers 105*a*-105*c*. As used herein module layers 105*a*-105*c* are also referred to as repeatable layers. A first portion of the module layers generally 105 have a pair of ports 107*a* (referenced for one of the module layers 105) on one side of the micro pressure sensor 100 (similar to ports 12*a*-12*c* FIG. 2), and a second portion of the module layers 105 have a pair of ports (not shown) on an opposite side (back) of the micro pressure sensor 100 (similar to ports 14*a*-14*d* FIG. 2). Each module layer 105*a*-105*c* thus has a pair of openings in one of here, four walls. The module layers 105*a*-105*c* are alternated such that the opening in one module is on a side of the micro pressure sensor 100, which is directly opposite the side having the opening in an adjacent module layer.

Figure 4A:
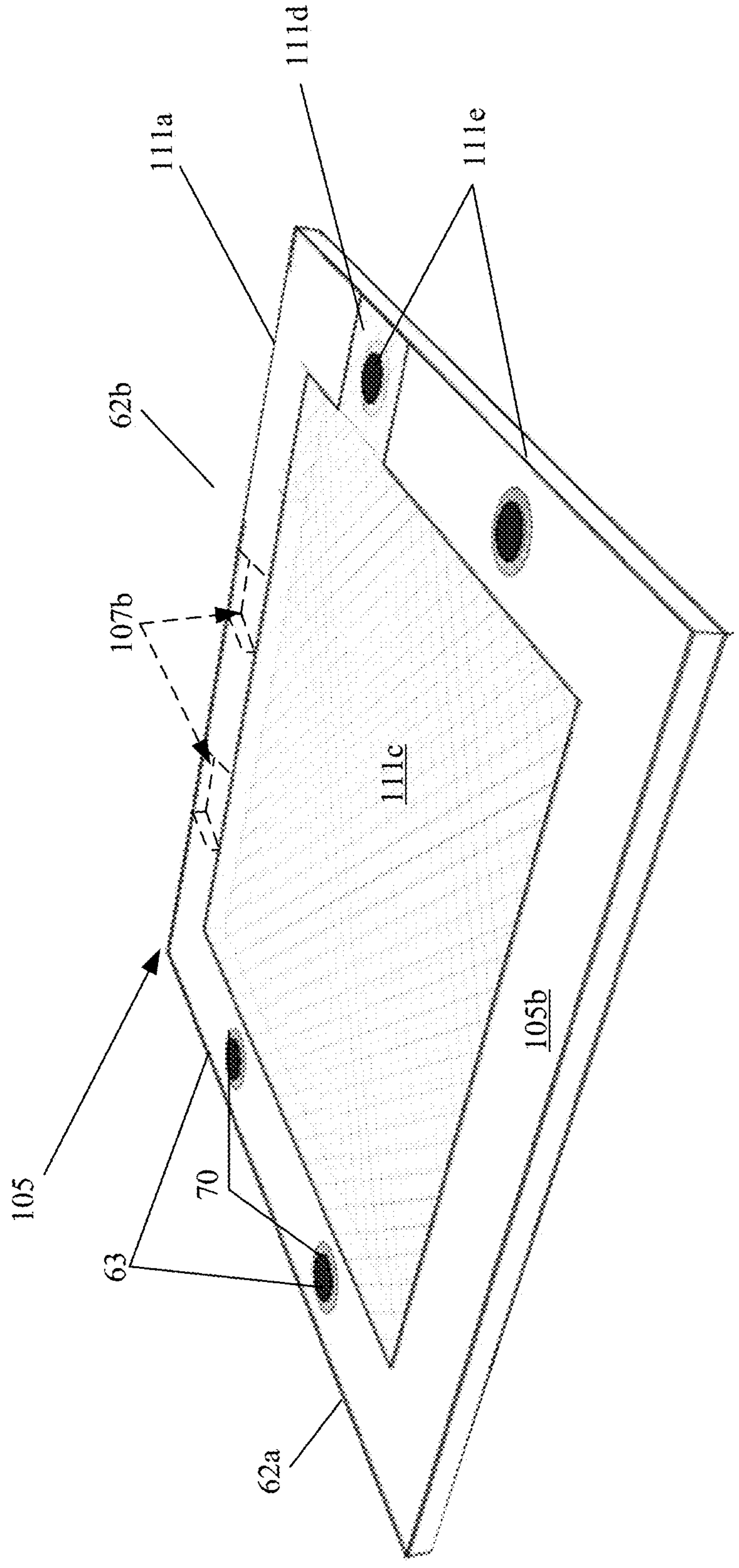
FIG. 4A is an isometric view of a module for the micro pressure sensor of FIG. 4.

Referring to FIG. 4A, a module layer generally 105 includes a body layer 111*a* that supports a membrane 111*b* that carries an electrode 111*c* and which provides (together with another membrane on another module) a compartment. The body layer 111*a* has a pair of ports 107*b*. The electrode 111*c* has a tab 111*d* for connection by metal vias to the measurement circuit. Holes 111*e* are provided through peripheral portions of the body 111*a*. Each module 105 has one hole that contacts through the metal via one tab 111*d*. A stack of four modules 105 thus is used to contact through the metal vias each of the four holes. Thus, as shown in FIG. 4, the electrode 111*c* in a top module, e.g., module 105*a* contacts through the metal via the first hole and the electrode 111*c* in a fifth module (first one of the modules 105*b* in stage 102*b*) from the top module 105*a* in the stack contacts through the metal via the hole in the corresponding location of the fifth module as the hole in the first module.

The electrodes can be a pre-prepared sheet to be attached to the other elements, the electrodes can be formed directly onto those elements, e.g., by printing or with other techniques discussed below. Thus multiple, e.g., two, three, or any desired number of, modules and module layers are stacked on top of each other to form multiple intermediate compartments in a modularized, stacked micro pressure sensor 100. In the stack, each membrane is separated by the body and each body is separated by a membrane. To form a complete modularized, stacked micro pressure sensor 100, the end caps are placed on each of the top and bottom ends of the stack of modules so that the end caps on the modules form two fixed end walls of the modularized, stacked micro pressure sensor, as shown in FIG. 4.

Each of the three stages 102*a*-102*c* are configured to be highly sensitive to a specific range of pressures. That is one stage, e.g., stage 102*a* is highly sensitivity to pressure in a given pressure range, e.g., R1, whereas stages 102*b* and 102*c* provide a relatively small contribution to sensitivity to pressures in the pressure range R1, but each of the stages 102*b*-102*c* are highly sensitivity to pressures in given pressure ranges R2 and R3 respectively, while providing a relatively small contributions to sensitivity to pressure changes outside of their respective pressure ranges.

Also shown in FIG. 4 are a capacitance measurement circuit and controller (as discussed in FIG. 2) that are coupled to electrodes (represented by lines 106*a*, 106*b*) of the broad range micro pressure sensor 100, as shown. Vias 108*a*-108*d* exist on edges of each of the module layers 105. Internally, vias 108*a* and 108*b* are connected to provide effectively the connection represented by line 106*a*, and vias 108*c* and 108*d* are connected and provide effectively the connection represented by line 104*b*.

Figure 5:
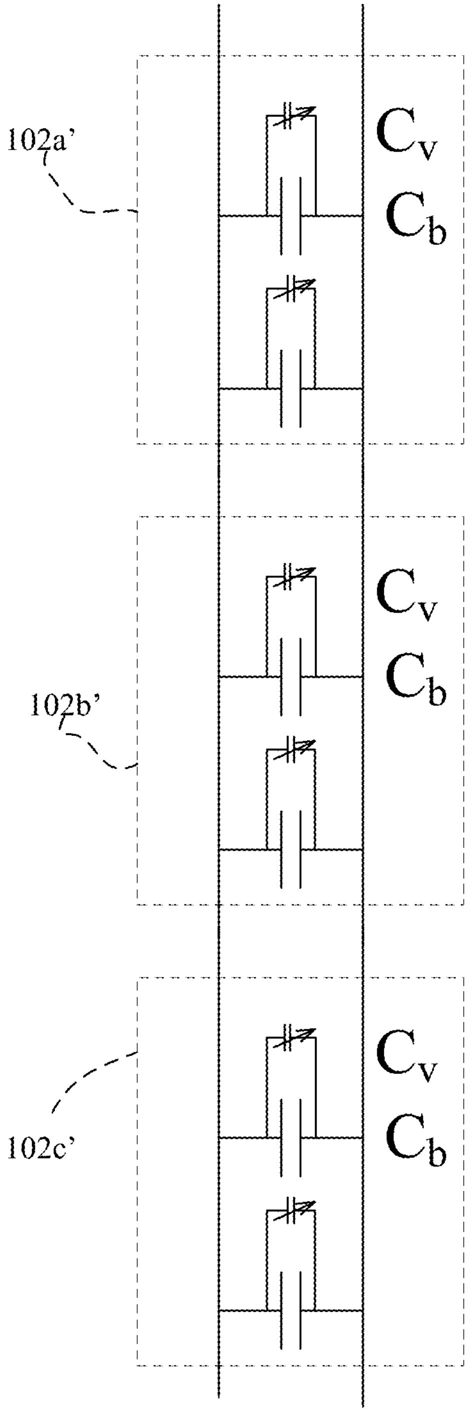
FIG. 5 is a simplified schematic view showing an equivalence circuit model of capacitance for the modular micro pressure sensor of FIG. 4.

Referring now to FIG. 5, each of the stages 102*a*-102*c* can be electrically modeled 120*a*'-120*c*' as a capacitor having a bulk capacitance value $C_b$ corresponding to a quiescent or rest position of the membrane (pressure difference of zero) and a variable capacitance value $C_v$ corresponding to a flexed position of the membranes in response to a non-zero pressure difference. In FIG. 5, each of the models 120*a*'-120*c*' are shown as having the bulk capacitance value $C_b$ and variable capacitance value $C_v$ corresponding each module layer 105 in the respective stages. Each of the capacitors are electrically connected in parallel. Capacitors connected in parallel have a total capacitance that is the sum of capacitances of the individual capacitors.

Several approaches can be used to provide the micro pressure sensor 100. Fundamentally, common to all approaches is fabrication of plural modules that have corresponding high sensitivities to different pressure ranges. Such plural modules that have corresponding high sensitivities can be configured to have plural sub-compartments (each of at least two sub-compartments) having high sensitivities to different pressure ranges.

One mechanism to provide high sensitivity over broader ranges of pressure for a given standard size chamber is make the membranes of different stiffness relative to each other. Described now is a mechanism to provide membranes with different ‘effective’ stiffness by providing different aperture sizes within a compartment to make the membrane effectively more or less stiff. In general, the stiffer the membrane the more pressure would be required to flex the membrane.

Referring now to FIGS. 6A-6C, these figures show three different patterns for forming body layers to provide sub-compartments within a body layer. Over groups of the body layers (e.g., one or more body layers in a stack) are disposed membranes enclosing the sub-compartments. The membranes carry electrodes (both not shown) that together with the body layer provides a module layer 105 (as shown in FIG. 5). The body layer is patterned to provide a complex pattern of sub-compartments. While the complex pattern of each compartment can vary, these exemplary patterns shown in FIGS. 6A-6C depicts general concepts that could be followed in choosing patterns. Consider for instance, that each sub-compartment is enclosed in a frame of body layer material, that is each sub compartment is substantially surrounded by body layer material, but for passages into such sub-compartments. By being surrounded by a frame of body layer material provides suitable surfaces by which membranes can adhere to the body layer.

FIG. 6A is an example of a complex pattern of sub-compartments of two different size areas. One sub-compartment 23*a* is a large sub-compartment and the others are twelve smaller sub-compartments 23*b* of substantially the same area relative to sub-compartment 23*a*. In FIG. 6A, the large sub-compartment 23*a* and four of the relatively smaller sub-compartments 23*b* are fluidly connected to the port 107*a*, and the remaining eight relatively smaller sub-compartments 23*b* are fluidly connected to the port 107*b*.

FIG. 6B is an example of a complex pattern of sub-compartments of three different size areas. Two sub-compartments 24*a* are large sub-compartments, four sub-compartments 24*b* are smaller relative to sub-compartments 24*a* and two other sub-compartments 24*c* are smaller relative to sub-compartments 24*b*. In FIG. 6B, one of the large sub-compartments 24*a*, three of the smaller sub-compartments 24*b* and one of the still smaller sub-compartments 24*c* are fluidly connected to one of the ports 107*a* and the remaining large sub-compartment 24*a*, and three smaller sub-compartments 24*b* and sub-compartment 24*c* are fluidly connected to port 107*b*.

FIG. 6C is an example of a complex pattern of sub-compartments of four different size areas. Two sub-compartments 25*a* are relatively large sub-compartments, two sub-compartments 25*b* are smaller relative to sub-compartments 25*a*, two other sub-compartments 25*c* are smaller relative to sub-compartments 25*b* and four other sub-compartments 25*d* are smaller relative to sub-compartments 25*c*. In FIG. 6B, one of the large sub-compartments 25*a* and one of each smaller sub compartments 25*b*, 25*c* and 25*d* are fluidly connected to one of the ports 107*a* and the remaining sub-compartments are fluidly connected to port 107*b*.

In FIGS. 6A-6C the sub-compartments can be patterned entirely through the body layer material, i.e., open apertures, i.e., holes (that are covered by membranes) in providing module layers, in some instances, it may be required or desired to only partially pattern through the body layer material, providing shallow regions (that are covered by membranes) rather than holes within body layer, with body layer material remaining on a backside of the module. This approach to modifying the effective stiffness of each compartment is relatively straightforward to implement in processing techniques discussed below.

Again for reference, a standard size compartment can be defined. While a standard size compartment could be of any size, for discussion herein it is nominally 1.5 mm long by 1.5 mm wide by 50 microns high. Each complex patterned compartment is formed from the micro sensor body material by patterning that material to form plural sub compartments that define the particular complex pattern within the standard size compartment (examples of which were shown in FIGS. 6A-6C). That is, within a “standard size compartment” are plural sub-compartments that have selected sizes (surface area) with respect to the reference standard size compartment.

Again with respect to the standard size compartment reference, the complex pattern compartment can be any pattern that leaves body material within portions of the otherwise standard size compartment forming plural sub compartments within the standard size compartment.

The membranes carry electrodes and a compartment is bounded by a pair of membranes each of which carries a corresponding electrode.

With the complex pattern compartment of FIGS. 6A-6C, fluid, e.g., air enters through ports 107*a*, 107*b* filling all of the sub-compartments in the complex pattern compartment, and all portions of the compartment experience the same pressure. As the pressure increases in the given compartment relative to a pressure in adjacent compartments (which are at the reference, e. g. ambient coupled to ports 109*a*, 109*b*), the membranes of each compartment will flex (as in FIGS. 2, 3). As the membranes flex, capacitance will change according to the amount of flexure experienced by the membranes.

Referring now back to FIG. 4A, and consider FIG. 6A, assume that the pattern of FIG. 6A is used in the module layer 105*a* that is part of the stage 102*a* (FIG. 4) and the module 105*a* is sensitive over a range of 2 to 4 psi.

Up to 2 psi the amount of flexure of the membrane 105*b* will be relatively minimal. This is because the sizing (surface area) of the sub-compartments 23*a* and 23*b* is selected to be minimally responsive to pressures below 2 psi. The sensitivity (change in capacitance vs. change in pressure) can be modeled knowing the Young’s modulus of the membrane/electrode combination, surface area of the aperture, dielectric constants of material between pairs of electrodes, size of the electrodes, and height of the aperture, generally as discussed above. At or slightly above 2 psi, the portion of the membrane over the sub-compartments 23*a*, 23*b* will start to flex.

However, the amount of flexure of the membrane 105*b* at or slightly above 2 psi over the sub-compartment 23*a* will substantially more than the amount of flexure over the sub-compartments 23*b*. The relative amounts of flexure would be related to differences in surface area of membrane portions over the sub-compartments 23*a* and 23*b*, because the membrane 105*b* is affixed to the body layer along the frame of the body as well as interior portions, thus effectively providing individual membranes over each of the sub-compartments 23*a*, 24*a*. At some pressure above 2 psi, but below 4 psi, the membrane portion over the sub-compartment 23*a* will no longer be responsive, and both membrane 105*b* and a corresponding membrane 105*b* from an adjacent module layer 105 will come together and touch.

However, the membrane portions over the sub-compartments 23*b* will still be responsive to pressure changes and thus will provide concomitant changes in capacitance. Thus, each distinct pair of electrodes on membranes covering provide effectively a fixed or bulk capacitance and a variable capacitance in parallel. Each module and each sub-compartment likewise effectively a fixed or bulk capacitance and a variable capacitance all of which are in parallel and thus add together to provide a total fixed or bulk capacitance and total variable capacitance. Design considerations to consider include the provision that no sub-compartment should exhibit a maximum pressure that will cause the membrane to flex and exceed the elastic limit of the material of the membrane.

Each stage 102*a*-102*c* therefore can be comprised of plural module layers 105 and within a given stage 102*a*-102*c*, the plural module layers 105 can be of one of the types discussed in FIGS. 6A-6C. In one implementation, stage 102*a* is comprised of plural module layers 105 of the type discussed in FIG. 6A, stage 102*b* is comprised of plural module layers 105 of the type discussed in FIG. 6B, and stage 102*c* is comprised of plural module layers 105 of the type discussed in FIG. 6C. Other arrangements and configurations may be possible.

Figure 7:
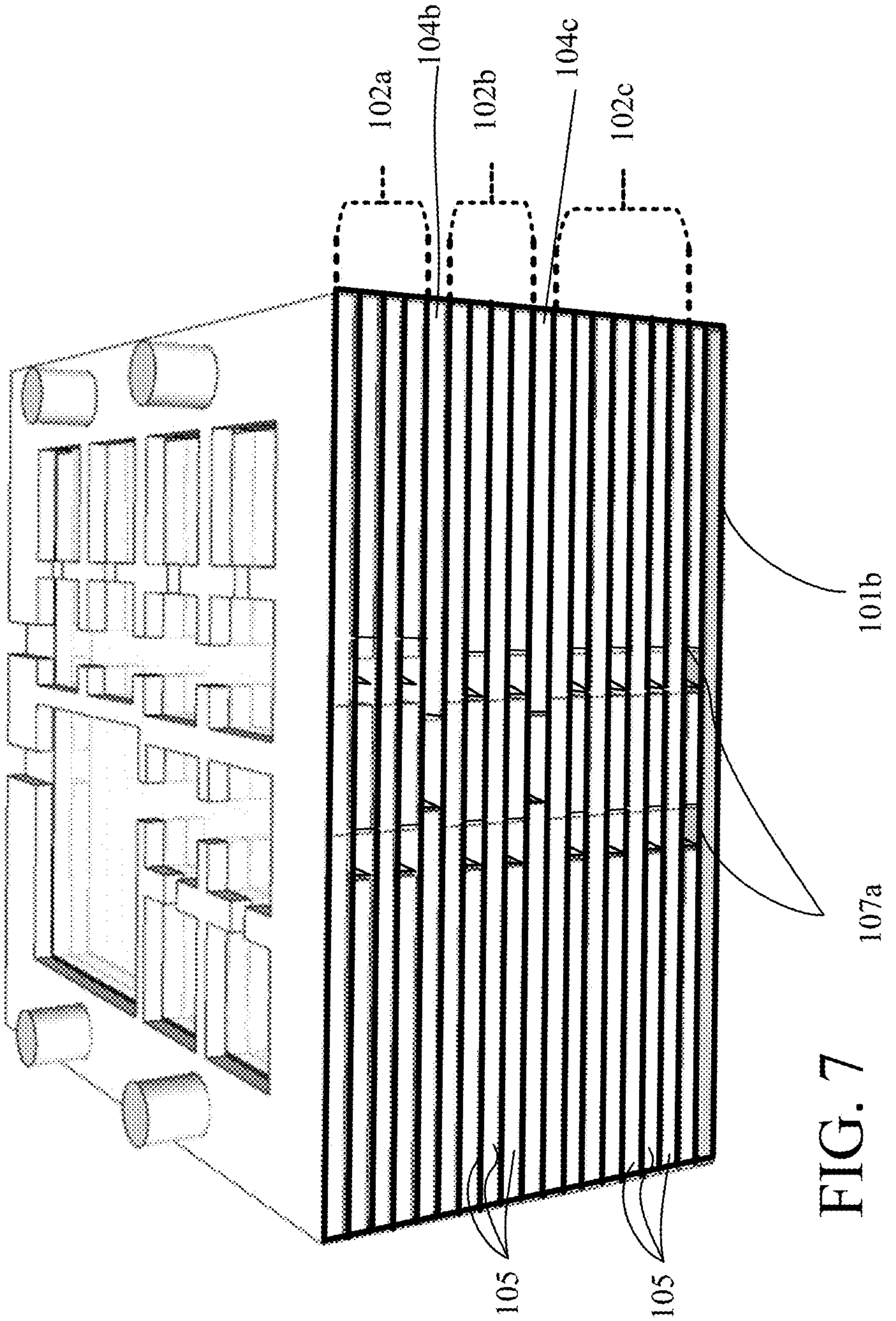
FIG. 7 is an isometric view of the modular micro pressure sensor of FIG. 4 showing a few layers removed.

FIG. 7 shows the modularized broad range micro pressure sensor 100 of FIG. 4 with the top cap and spacer layer, and the membranes/electrodes removed from the first few module layers 105 to illustrate the complex patterned body layers. Stages 102*a*-102*c* are indicated spaced by spacer layers 104*b* and 104*c* end cap 101*b* and front ports 107*a*.

Figure 8:
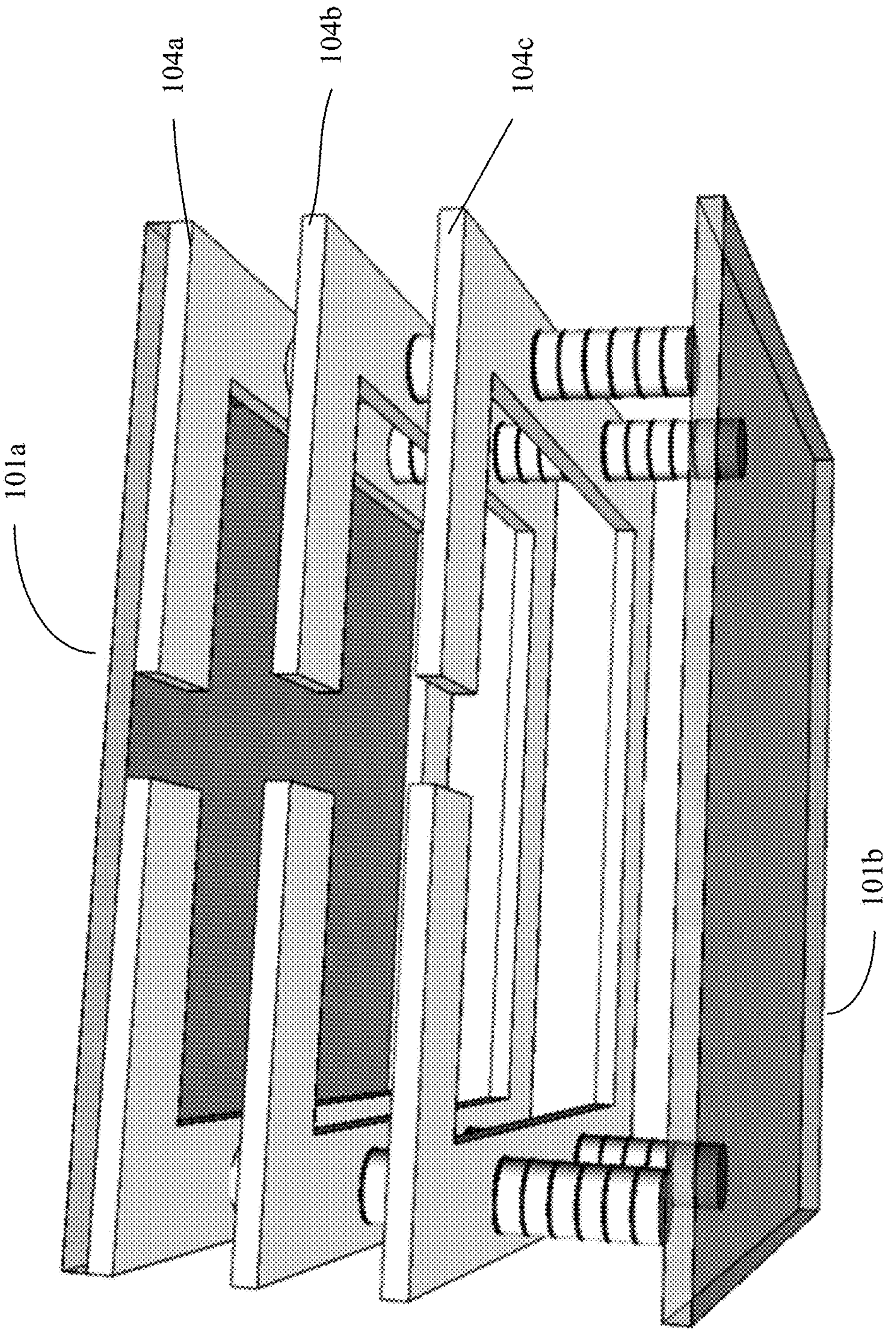
FIG. 8 is an isometric view of the modular micro pressure sensor of FIG. 4 showing all layers removed except for spacer members and end caps.

FIG. 8 shows the modularized broad range micro pressure sensor 100 of FIG. 4 with the module layers 105 (FIG. 4) removed, but showing the end caps 101*a*, 101*b* and the spacers 104*a*-104*c*.

Referring back to FIG. 4, the modularized broad range micro pressure sensor 100 thus can be fabricated from “standard sized” compartments (with respect to FIG. 1) of “standard sized” compartments comprised of stacked module layers 105, but which has a high pressure sensitivity over an extended pressure range, i.e., a “high sensitivity micro pressure sensor” by having at least some of the plural module layers patterned with complex compartments that again are in reference to the “standard sized” compartment, as discussed above. In one implementation, each set of module layers that form a module are comprised of an identical type of complex patterned compartment.

Each membrane of the micro pressure sensor 100 moves in two opposite directions relative to its central, nominal position. In response to a pressure difference on either side of a membrane, the membrane flexes to either expand or reduce a distance itself and an adjacent membrane and thus between a pair of electrodes carried by itself and the adjacent membrane, and concomitant therewith either increasing or decreasing a capacitance value of an effective capacitor provided between the two electrodes. The membrane travels a distance less than, e.g., half of, the height of the compartment. As a result, the membrane experiences less flexing and less stress, leading to longer life and allowing for greater choice of materials.

In addition, because each one of the membranes carries but one electrode, and capacitance is being sensed, these capacitors and more specifically these electrodes can be connected, such that the capacitors are connected in parallel. Capacitors connected in parallel add in capacitance. Thus by connecting the capacitors formed by the membranes and pairs of electrodes in parallel, the modularized broad range micro pressure sensor 100 will have a higher bulk capacitance and a higher range of variable capacitance, and thus greater sensitivity (change in pressure per change in capacitance) compared a single capacitor formed by a single membrane and pair of electrodes. Exemplary values for sensitivity can be such as 0.02 pf capacitance change per 0.05 psi change over a range of 0.0 to 100 psi. Other ranges and sensitivities can be provided by different selections of materials and dimensions of a compartment and sub compartments, as well as providing more or few module layers per module and more or fewer modules per modularized broad range micro pressure sensor 100.

The membranes, the end caps, and the body can have the same dimensions, and the electrodes can have smaller dimensions than the membrane or the other elements. In some implementations, the membrane has a dimension of about microns by microns to about millimeters by millimeters, and a thickness of about 5 microns. The body has an outer dimension of about microns by microns to about millimeters by millimeters, a thickness of about 50 microns, and an inner dimension of about microns by microns to about millimeters by millimeters. The thickness of the body defines the nominal size of the compartment (similar to compartments FIG. 1). The electrodes have dimensions that substantially correspond to inner dimensions of the body. In some implementations, the electrodes have a surface area of about 2.25 $mm^2$ and a thickness of about 0.01 microns (100 Angstroms). An assembled module layer was shown in FIG. 4A.

Referring now to FIG. 9, a table of exemplary calculated values is shown that has for a standard micro pressure sensor (from the incorporated by reference application) calculated capacitance values in pico-farads for one module and seven module micro pressure sensors, with separations (distances between electrodes) and corresponding pressures expressed in cm of water. At 50 microns, separation (resting state) the capacitance of one capacitor is 0.38 pF and for seven 2.26 pF, with 0.00 cm of water pressure. Similar characterizations can be provided for the micro pressure sensors 10 and 100.

Figure 10:
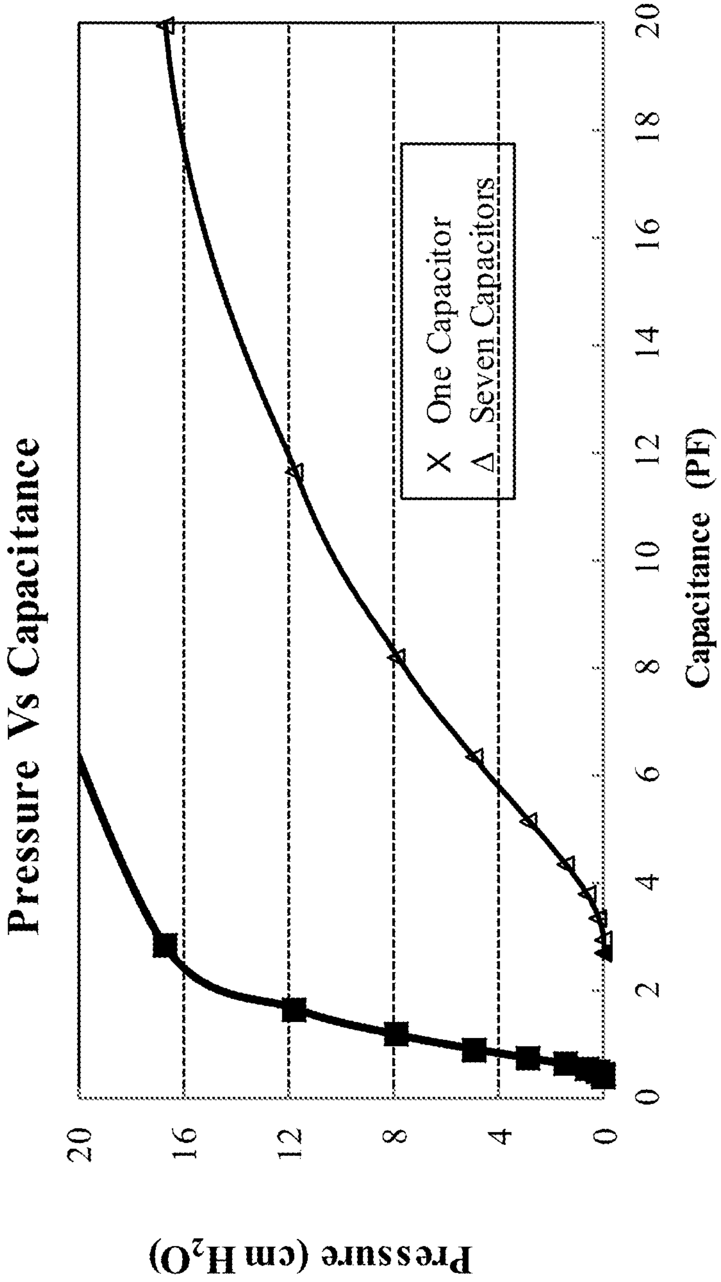
FIG. 10 is a plot of pressure vs. capacitance.
Figure 11:
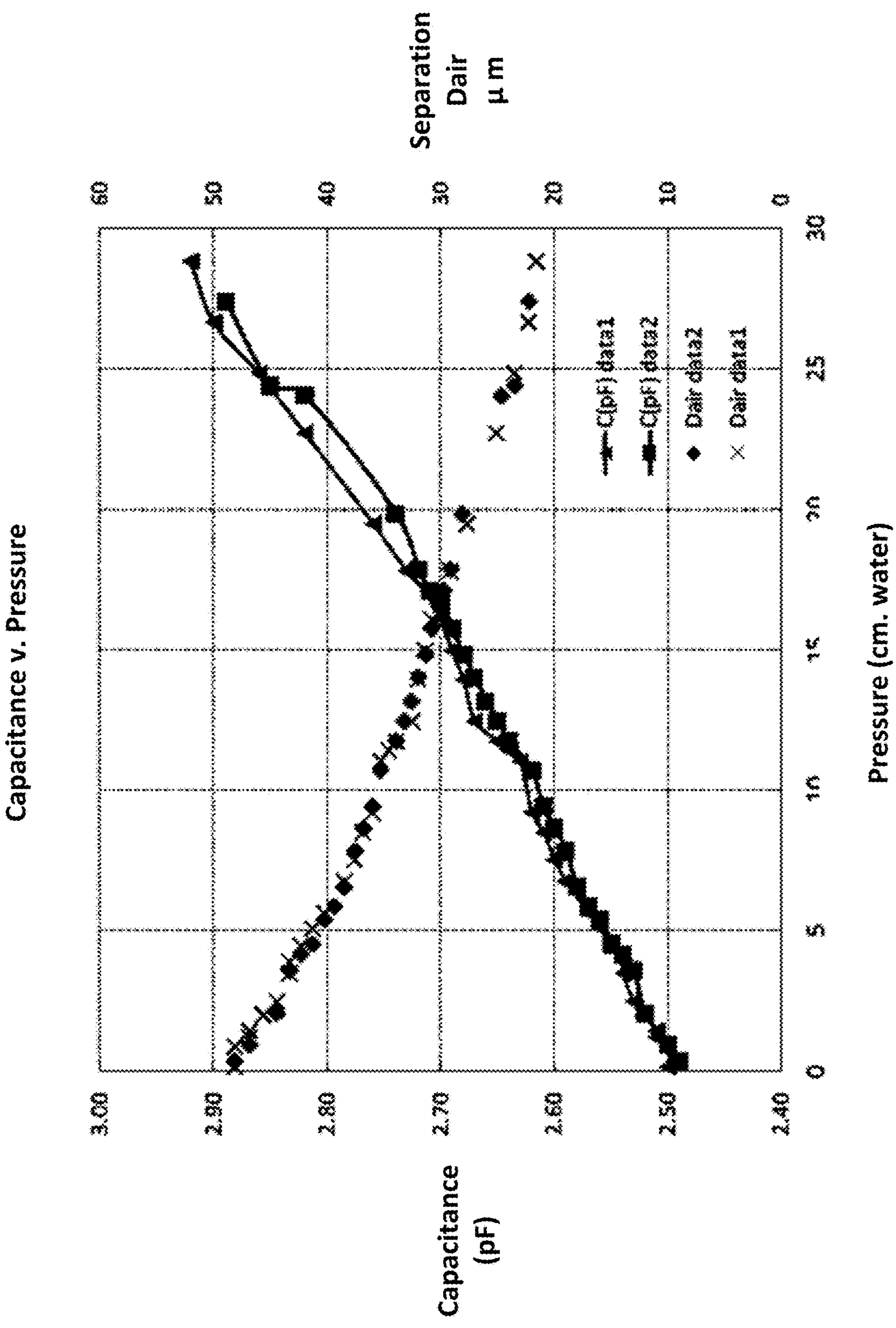
FIG. 11 are plots of capacitance v. pressure and membrane separation vs. pressure.

FIGS. 10 and 11 show exemplary plots for a standard micro pressure sensor (from the incorporated by reference application) with FIG. 10 plotting pressure (cm of water) vs. capacitance in pF for one and seven modules (capacitors). With seven modules, a greater range in capacitance would be provided for the same pressure range in comparison to capacitance range for one capacitor (single stage module). Similar characterizations can be provided for the micro pressure sensors 10 and 100.

FIG. 11 shows that capacitance vs. pressure and separation vs. pressure to be substantially linear in the operating range of the standard micro pressure sensor (from the incorporated by reference application). Similar characterizations can be provided for the micro pressure sensors 10 and 100.

Roll to Roll Processing for Producing Micro Pressure Sensors

Figure 12:
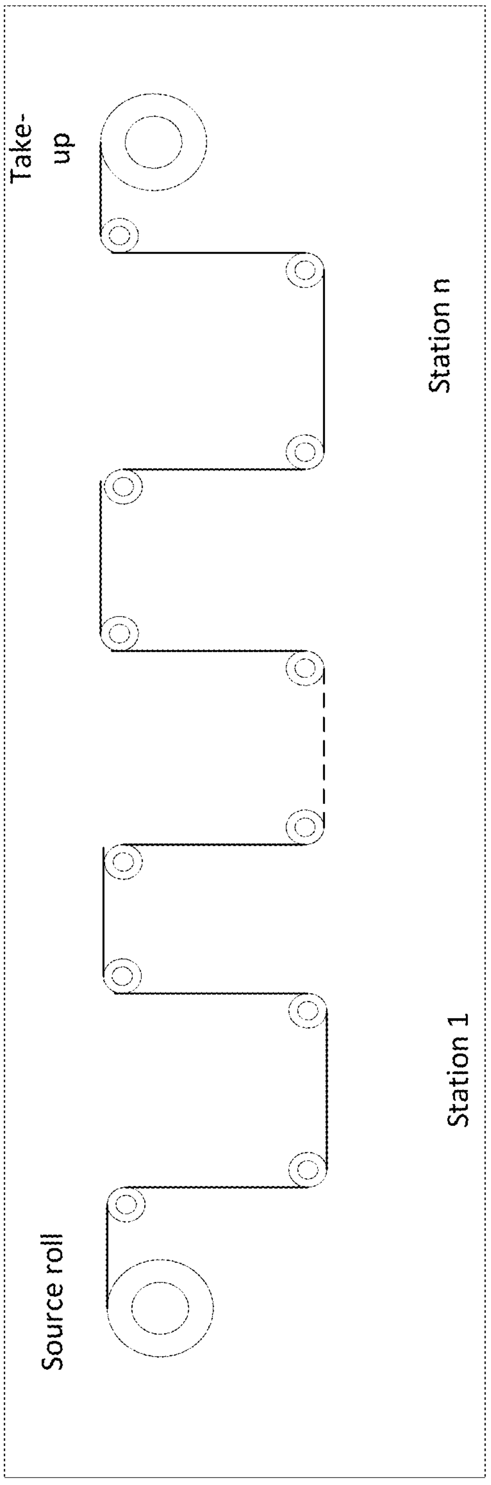
FIG. 12 is a conceptual diagram of a roll to roll processing configuration.
Figure 12A:
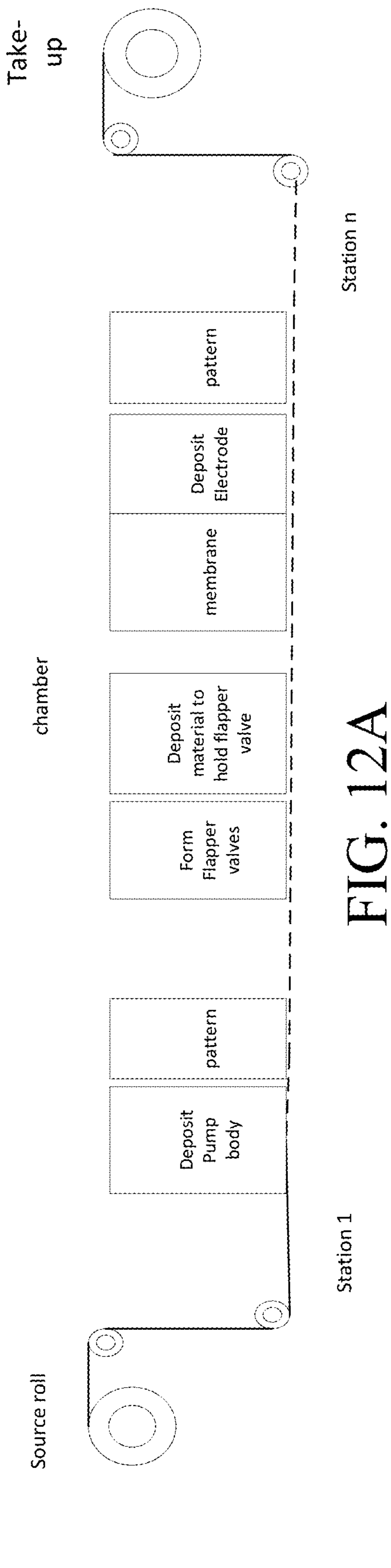
FIG. 12A is a conceptual view of some of the exemplary roll to roll processing stations.

Referring to FIGS. 12, 12A, a conceptual view of a roll to roll processing line is illustrated. The processing line comprises several stations, e.g., station 1 to station n (that can be or include enclosed sub-compartments) at which deposition, patterning, and other processing occurs. Processing viewed at a high level thus can be additive (adding material exactly where wanted) or subtractive (removing material in places where not wanted). Deposition processing includes evaporation, sputtering, and/or chemical vapor deposition (CVD), as needed, as well as printing. The patterning processing can include depending on requirements techniques such as scanning laser and electron beam pattern generation, machining, optical lithography, gravure and flexographic (offset) printing depending on resolution of features being patterned. Ink jet printing and screen printing can be used to put down functional materials such as conductors. Other techniques such as punching, imprinting and embossing can be used.

The original raw material roll is of a web of flexible material. In roll to roll processing the web of flexible material can be any such material and is typically glass or a plastic or a stainless steel. While any of these materials (or others) could be used, plastic has the advantage of lower cost considerations over glass and stainless steel. Specific materials will be determined according to the application of the micro pressure sensor. In applications materials such as stainless steel or other materials that can withstand encountered temperatures would be used, such as Teflon and other plastics that can withstand encountered temperatures.

For the structures shown in FIGS. 1-4, stations within a roll to roll processing line are set up according to the processing required. Thus, while the end cap and top caps could be formed on the web or plastic sheet in one implementation the end and top caps are provided after formation of the micro-pressure sensor stack, as will be described.

The plastic web is used to support the body by a deposition of material on the web at a deposition station followed by patterning station. The body is formed at a forming station. The web having the body has a membrane deposited over the body at a station. Over the membrane is deposited an electrode at deposition station which is patterned at patterning station. Membrane sheet with patterned electrodes supported on the membrane are provided on the body. Electrical interconnects, for connecting to the electrodes on each membrane, are provided by depositing conductive materials, e.g., gold, silver, and platinum layers (or conductive inks such as silver inks and the like). In some implementations some of the electrical circuit components are printed onto the membranes.

The roll having the micro module units (body and membrane with electrode and electrical connections) are diced and the micro module units are collected, assembled into stacks of micro modules, and packaged by including the end and top caps to provide the micro pressure sensor 10 or 100. Depending upon the layout of the units on the web it may be possible to fold the web of the module units into a stack of units, with electrodes provided on the membrane layer or whole layers of many units can be laminated together to produce a stack prior to being diced and packaged.

The membrane material is required to bend or stretch back and forth over a desired distance and thus should have elastic characteristics. The membrane material is impermeable to fluids, including gas and liquids, is electrically non-conductive, and possesses a high breakdown voltage. Examples of suitable materials include silicon nitride and Teflon.

The material of the electrodes is electrically conductive. The electrodes do not conduct significant current. The electrodes are subject to bending and stretching with the membranes, and therefore, it is desirable that the material is supple to handle the bending and stretching without fatigue and failure. In addition, the electrode material and the membrane material adhere well, e.g., do not delaminate from each other, under the conditions of operation. Examples of suitable materials include, e.g., gold, silver, and platinum layers (or conductive inks such as silver inks and the like). A release material can be used for allowing for valve movement. Suitable release materials include, e.g., the sacrificial filling material mentioned above.

Figure 13A:
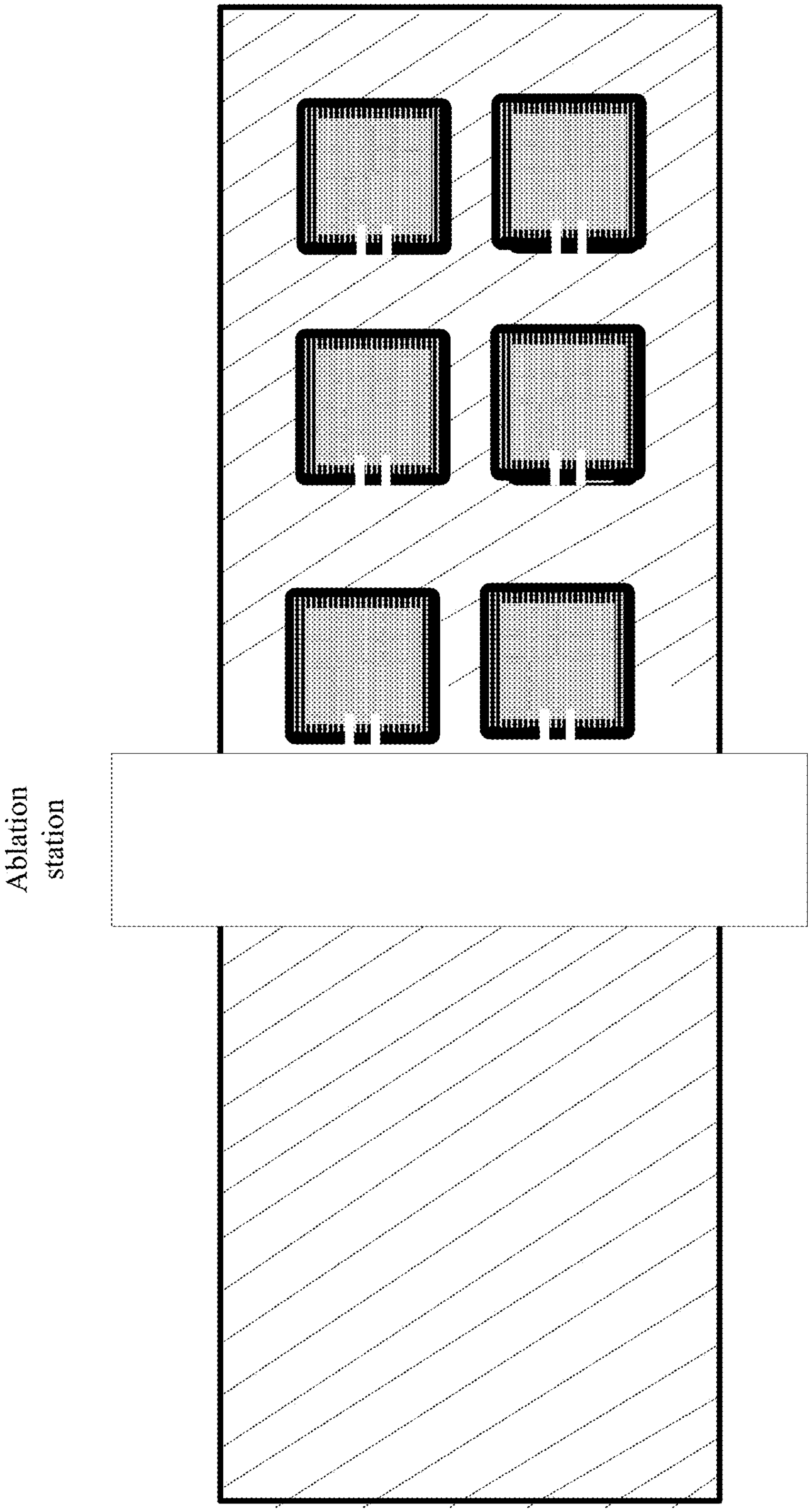
FIGS. 13A-13C are views of roll to roll processing for the structure of FIG. 4, showing the pattern of FIG. 6A.
Figure 13B:
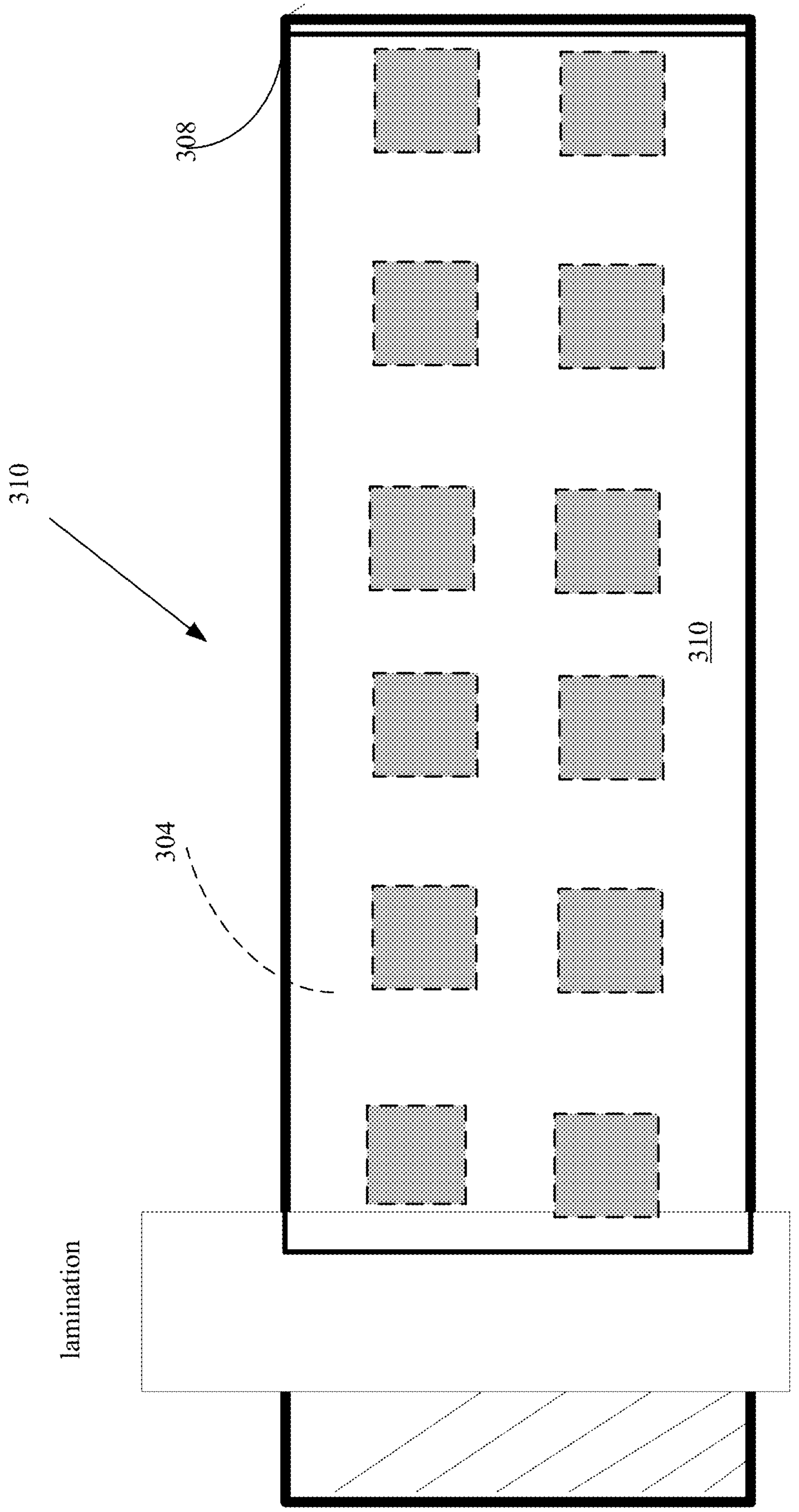
Figure 13C:
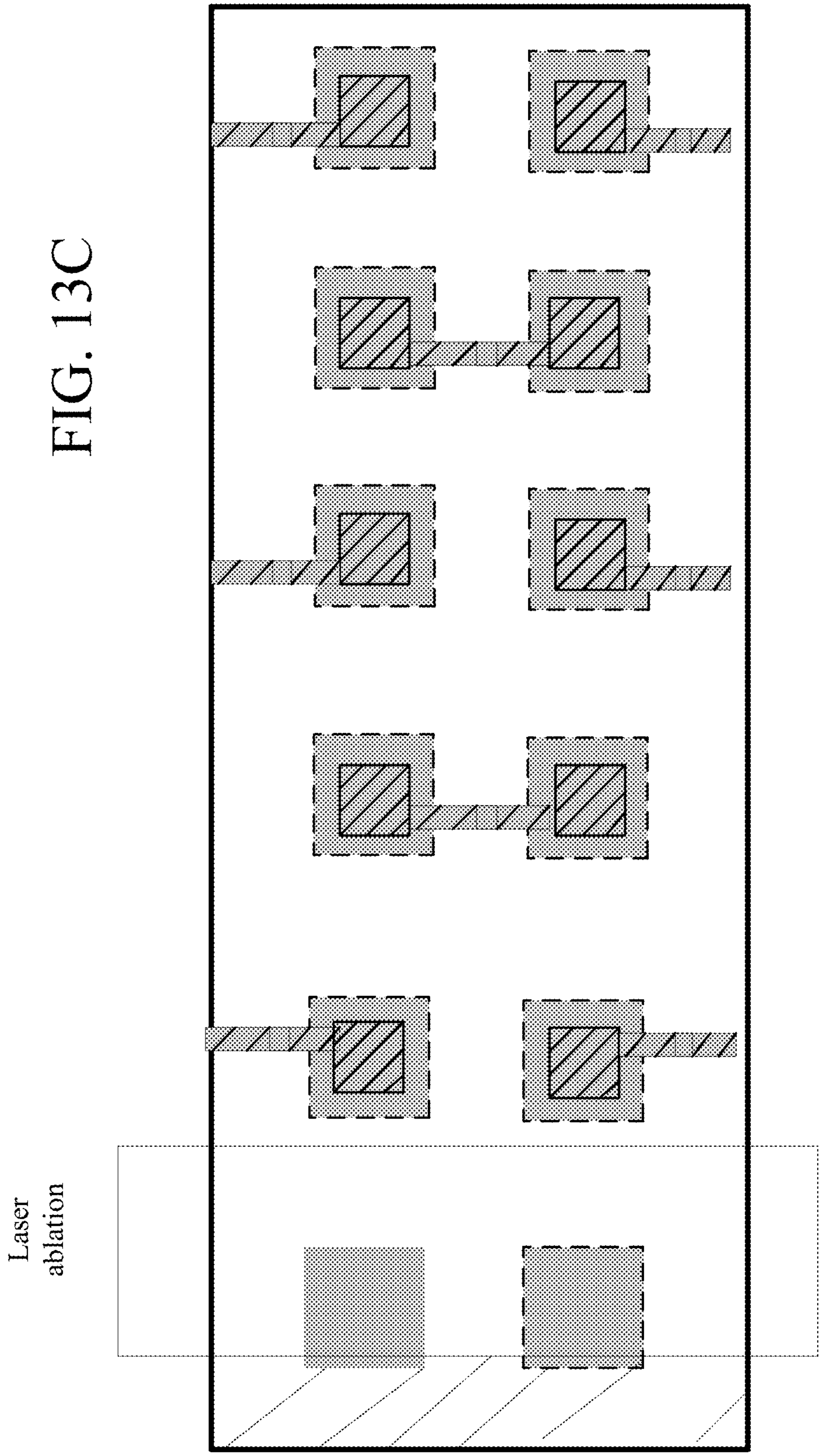

Referring to FIGS. 13A-13C, an alternative roll to roll processing approach to provide the micro pressure sensor 100 is shown. The micro pressure sensor has the membranes, which flex in operation. The micro pressure sensor is fabricated using roll to roll processing where a raw sheet (or multiple raw sheets) of material is passed through plural stations to have features applied to the sheet (or sheets) and the sheet (or sheets) are subsequently taken up to form parts of the repeatable composite layers (See FIG. 4) to ultimately produce a composite sheet of fabricated micro pressure sensors.

Referring to FIG. 13A a sheet of a flexible material such as a glass or a plastic or a stainless steel is used as a web. For the particular implementation of the micro pressure sensor the material is a plastic sheet, e.g., Polyethylene terephthalate (PET). The sheet and hence body layer is a 50 micron thick sheet of PET. Other thicknesses could be used (e.g., the sheet and body layer could have a thickness between, e.g., 25 microns and 250 microns (or greater) and the membrane, nominally 5 microns could be, e.g., being about 10% of the thickness of the body. The thicknesses are predicated on desired properties of the micro pressure sensor and the handling capabilities of roll to roll processing lines. These considerations will provide a practical limitation on the maximum thickness. Similarly, the minimum thicknesses are predicated on the desired properties of the micro pressure sensor to be constructed and the ability to handle very thin sheets in roll to roll processing lines.

For the micro pressure sensor 10 or 100, the layers would have thicknesses as mentioned above approximately 50 microns for the body layers and 5 microns for the membrane elements of the micro pressure sensor. However, other thicknesses are possible. The sheet is micro-machined using a mask or direct write to configure a laser ablation station to define or form sub-compartments for micro pressure sensor 10 or 100 (e.g., the complex patterned sub-compartments as desired examples shown in FIG. 6A-6C), as well as alignment holes (not shown but will be discussed below). Vias are also provided for electrical connections. The micro-machining ablates away the materials, e.g., plastic to form the sub-compartments while leaving the frame portion of the body.

Referring now to FIG. 13B, the sheet with the defined compartment is laminated at a lamination station to a second sheet, e.g., 5 micron thick sheet of PET, with a metallic layer of Al of 100 A on a top surface of the sheet. This second sheet forms the membranes over the bodies provided by the defined features of the sub-compartments. The second sheet is also machined to provide the alignment holes (not shown).

Prior to lamination of the second sheet to the first sheet, the second sheet is also provided with several randomly dispersed holes or view ports (not shown) over some areas that will be in alignment with the body structures. These randomly dispersed holes are used by a machine vision system to reveal and recognize underlying features of the body units on the first sheet. Data is generated by noting the recognized features in the first sheet through the random holes. These data will be used to align a third ablation station when forming electrodes from the layer over the bodies.

The second sheet is laminated to and thus sticks (or adheres) to the first sheet in areas where there is plastic on the first sheet and plastic on the second sheet. At this point, a composite sheet of repeatable units of the micro pressure sensor are formed, but without electrodes formed from the layer on the membrane.

The machine vision system produces a data file that is used by the laser ablation system in aligning a laser ablation station with a mask (or direct write) such that a laser beam from the laser ablation system provides the electrodes according to the mask, with the electrodes in registration with the corresponding portions of the bodies. The electrodes are formed by ablating away the metal in regions that are not part of the electrodes and conductors, leaving isolated electrodes and conductors on the sheet. The registration of the patterned electrodes to the body is thus provided by using the machine vision system to observe features on the front side of the laminated structure providing positioning data that the laser ablation system uses to align a laser beam with a mask, using techniques commonly found in the industry.

Referring now to FIG. 13C, the composite sheet is fed to the laser ablation station, to form the electrodes by ablating the 100 A° Al layer deposited on the second sheet that formed the membrane. The composite sheet is patterned according to the mask to define the electrodes over corresponding regions of the body. The ablation station ablates away metal from the metal layer leaving isolated electrodes on the sheet.

A jig (not shown) that can comprises vertical four posts mounted to a horizontal base is used to stack individual ones of the cut dies. On the jig an end cap (e.g., a 50 micron PET sheet with a metal layer) is provided and over the end cap a first repeatable unit is provided. The repeatable unit is spot welded (applying a localized heating source) to hold the unit in place on the jig. As each repeatable unit is stacked over a previous repeatable unit that unit is spot welded. The stack is provided by having ports on one side of the stack and ports on the other of the stack, and staggered resulting from arrangement of the valves so as to have a solid surface separating each of the ports in the stack (See FIG. 6). Once a stack is completed, a top cap (not shown) can be provided. The stack unit is sent to a lamination station not shown, where the stack is laminated, laminating all of the repeatable units and caps together. The end cap and top cap can be part of the packaging as well. Otherwise sets of repeatable units can be laminated or welded in pairs. Other stacking techniques for assembly are possible with or without the alignment holes.

Figure 14B:
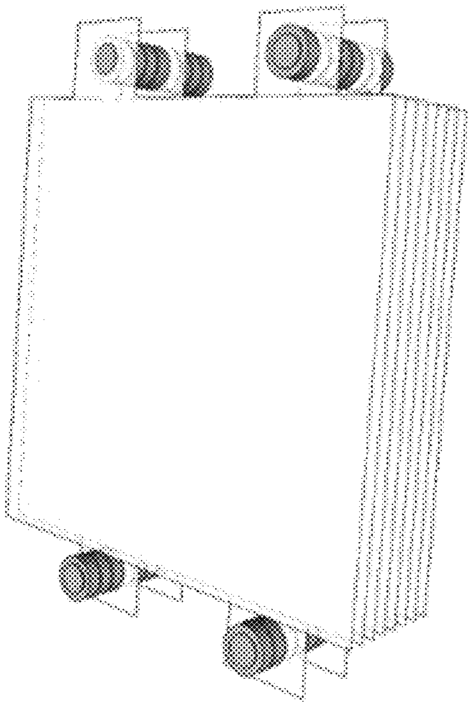
FIGS. 14A-14B are views depicting details of via conductors.
Figure 14A:
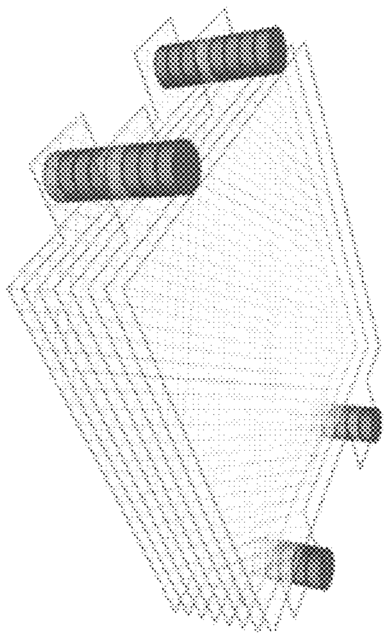

Referring now to FIGS. 14A, 14B, details of via conductors to interconnect the patterned electrodes on the modules generally 105 as above are shown. In these figures only the electrodes and the tabs are shown with the via conductors. The body portions are not shown for ease in understanding the via conductor structure. The via conductors are castellated structures, i.e., with relatively wide areas contacting electrode tabs and relatively narrow areas through holes in the electrode. This arrangement is provided by having the holes in the body portions larger than the holes through the electrode portions. This can be accomplished during the patterning stages of the body and the electrodes respectively. The via conductors are formed by introduction of the conductive inks mentioned above into the holes.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein. In addition, while pressure modules are illustrated in a stack other arrangements may be possible, including pressure modules adjacent to each other and spaced from each other, provided that the pressure modules are outfitted with corresponding end caps and have inlets and outlets being fed from a common pressure source and a common reference. In addition, the electrodes on membranes can be patterned to correspond to underlying patterned sub-compartments (with concomitant increase in the number of capacitances that need to be measured and interconnected) and a membrane for a given module can be single membrane or can be divided into individual membranes corresponding to the underlying patterned sub-compartments. Other embodiments are within the scope of the following claims.

What is claimed is:

1. A pressure sensor comprises:

a plurality of module stages, at least one of the plurality of module stages operative over a first range of pressure and at least one other of the plurality of module stages operative over a second, different range of pressure, with each module stage comprising:

a stack of at least two module layers, each module layer comprising:

a module body having walls that define a compartment with at least one of the module layers having the defined compartment partitioned into at least two sub-compartments having at least two different volumes;

a port for fluid ingress or egress disposed in a first wall of the module body, with remaining walls of the module body being solid;

a membrane affixed to a first surface of the module body covering the compartment; and an electrode affixed over a surface of the membrane.

2. The pressure sensor of claim 1 wherein both of the module layers have the at least two sub-compartments having the at least two different volumes, and the pressure sensor further comprises:

a first end cap connected to a first one of the plurality of modules; and a second end cap connected to a last one of the plurality of modules.

3. The micro pressure sensor of claim 2 wherein the sub-compartments having the at least two different volumes have a first volume of a larger volume than a second volume, with the first and second volumes configured to cause an amount of flexure of the first volume that is greater than an amount of flexure of the second volume, for a given pressure difference between a pressure of an input fluid relative to a reference pressure.

4. The pressure sensor of claim 1 wherein a first one of the at least two module layers has its port coupled to a pressure source, and a second one of the at least two module layers has its port coupled to a reference pressure, with each of the module layers in the stack having the membranes with dimensions in a range of about microns by microns to about millimeters by millimeters.

5. The pressure sensor of claim 1 wherein a first one of the plurality of modules has each module body partitioned into a first number of sub-compartments that are of at least two different surface areas, and a last one of the plurality of modules has each module body partitioned into a second, different number of sub-compartments that are of at least two different surface areas, and with the second number being greater than the first number.

6. The pressure sensor of claim 1 wherein a first one of the plurality of module layers has each module body partitioned into a first number of sub-compartments, and a last one of the plurality of module layers has each module body partitioned into a second number of sub-compartments, with the second number being greater than the first number.

7. The pressure sensor of claim 1 wherein a first one of the at least two module layers of a first module has its electrode electrically connected to an electrode of a first one of the at least two module layers of a second module to provide a first electrical connection to the pressure sensor, and a second one of the at least two module layers of the first module has its electrode electrically connected to a corresponding electrode of the second one of the at least two module layers of the second module to provide a second electrical connection to the pressure sensor, which is electrically isolated from the first electrical connection.

8. The pressure sensor of claim 1 further comprising:

a capacitance measurement circuit coupled between the first and the second electrical connections.

9. The pressure sensor of claim 8 further comprising:

a controller that converts measured capacitance from the capacitance measurement circuit into a value of pressure.

10. The pressure sensor of claim 1 wherein each port has a pair of apertures disposed in the first wall.

11. The pressure sensor of claim 1 wherein the pressure sensor is configured to receive a fluid flow into the ports of a first one of the at least two module layers and with the ports of a second one of the at least two module layers receiving a reference pressure, with the fluid flow causing the membranes to deflect according to pressure differences between the fluid flow and the reference applied to respective ports.

12. The pressure sensor of claim 1 wherein a fluid flow out of the port of the module layers causes the membrane over the compartment to recede into the compartment, and a fluid flow into the port of the module layers causes the membrane to move away from the compartment.

13. The pressure sensor of claim 1 wherein a fluid flow out of the port of a first one of the at least two module layers causes its membrane to compress the compartment, and a second fluid flow into the port of a second one of the at least two module layers disposed adjacent to the first module layer, causes its membrane to expand the compartment substantially simultaneously.

14. The pressure sensor of claim 13 wherein the port of the second module layer is coupled to the reference for an under-pressure mode.

15. The pressure sensor of claim 13 wherein the port of the first module layer is coupled to the reference for an over-pressure mode.

16. A micro pressure sensor comprising:

a first module operative over a first range of pressure, the first module comprising:

a first stack of a first plurality of first module layers, with each first module layer comprising:

a first module body having walls that define a compartment with the defined compartment partitioned into at a first plurality of sub-compartments;

a first port for fluid ingress or egress, the first port disposed in a first wall of the first module body, with remaining walls of the first module body being solid;

a first membrane affixed to a first surface of the first module body covering the compartment; and a first electrode affixed over a surface of the first membrane;

a second module operative over a second, different range of pressure, the second module affixed in the micro pressure sensor, the second module comprising:

a second stack of a second plurality of second module layers, each second module layer comprising:

a second module body having walls that define a compartment and with the defined compartment partitioned into at a second plurality of sub-compartments that are different in one or more of number and size of sub-compartments than the first plurality of sub-compartments;

a second port for fluid ingress or egress disposed in a first wall of the second module body, with remaining walls of the second module body being solid walls;

a second membrane affixed to a first surface of the second module body covering the compartment; and a second electrode affixed over a surface of the second membrane.

17. The micro pressure sensor of claim 16 further comprising:

at least one additional module of an additional stack of additional module layers.

18. The micro pressure sensor of claim 17 wherein the first plurality of sub-compartments are of two different volumes.

19. The micro pressure sensor of claim 18 wherein the second plurality of sub-compartments are of three different volumes.

20. The micro pressure sensor of claim 19 wherein the at least one additional module has a third plurality of sub-compartments, which third plurality of sub-compartments are of four different volumes.

21. The micro pressure sensor of claim 16 wherein the micro pressure sensor is coupled to a capacitance measurement circuit.

22. The micro pressure sensor of claim 16 wherein the first module is in a stack with the second module, and further comprises a spacer member disposed between the first module and the second module to affix the first module to the second module.

23. The micro pressure sensor of claim 16 wherein the first plurality of sub-compartments have sub-compartments of one of two different sizes, and the second plurality of sub-compartments have sub-compartments of one of three different sizes.

24. The micro pressure sensor of claim 16 further comprising:

a first end cap connected to a first one of the plurality of modules and a second end cap connected to a last one of the plurality of modules.

25. The micro pressure sensor of claim 16 wherein the first port that feeds the first plurality of sub-compartments has a pair of inlets, with a first one of the inlets feeding a first portion of the first plurality of sub-compartments and a second one of the inlets feeding a second, different portion of the first plurality of sub-compartments.

26. The micro pressure sensor of claim 16 wherein the first plurality of sub-compartments has the at least two different volumes, with a first volume being larger than a second volume, and which first volume causes an amount of flexure greater than the second volume, for a given pressure difference between a pressure of an input fluid relative to a reference pressure.

27. The micro pressure sensor of claim 26 wherein the second plurality of sub-compartments has the at least two different volumes that are also different than the at least two different volumes of the first plurality of sub compartments, and with a first volume of the second plurality of sub-compartments being larger than a second volume of the second plurality of sub-compartments, and which first volume causes an amount of flexure greater than the second volume, for a given pressure difference between a pressure of an input fluid relative to a reference pressure.

* * * * *